(12) United States Patent
Wendland et al.

(10) Patent No.: US 7,767,143 B2
(45) Date of Patent: Aug. 3, 2010

(54) COLORIMETRIC SENSORS

(75) Inventors: Michael S. Wendland, North Saint Paul, MN (US); Neal A. Rakow, Woodbury, MN (US); Michael C. Palazzotto, Woodbury, MN (US); Douglas E. Weiss, Golden Valley, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 4 days.

(21) Appl. No.: 11/426,729

(22) Filed: Jun. 27, 2006

(65) Prior Publication Data

US 2007/0297944 A1    Dec. 27, 2007

(51) Int. Cl.
*G01N 31/22* (2006.01)
*G01N 31/00* (2006.01)

(52) U.S. Cl. ............................ 422/56; 422/55; 422/50; 422/58; 422/60; 422/68.1; 422/82.05

(58) Field of Classification Search .............. 422/82.05, 422/82.09, 56, 1, 55, 50, 60, 58, 68.1; 359/588; 428/306.6, 349; 250/474, 472.1, 208.1; 264/425
See application file for complete search history.

(56) References Cited

U.S. PATENT DOCUMENTS

| | | | |
|---|---|---|---|
| RE24,906 E | 12/1960 | Ulrich | |
| 3,708,296 A | 1/1973 | Schlesinger | |
| 3,723,064 A | 3/1973 | Liotta | |
| 3,899,677 A * | 8/1975 | Hori et al. | 250/474.1 |
| 3,979,184 A | 9/1976 | Giaever | |
| 4,042,335 A | 8/1977 | Clement | |
| 4,069,055 A | 1/1978 | Crivello | |
| 4,090,849 A | 5/1978 | Healy et al. | |
| 4,216,288 A | 8/1980 | Crivello | |
| 4,250,311 A | 2/1981 | Crivello | |
| 4,478,942 A | 10/1984 | Katsuyama et al. | |
| 4,523,102 A * | 6/1985 | Kazufumi et al. | 250/208.1 |
| 4,558,012 A | 12/1985 | Nygren et al. | |
| 4,601,948 A * | 7/1986 | Lancaster et al. | 428/349 |
| 4,781,890 A | 11/1988 | Arai et al. | |
| 4,820,649 A | 4/1989 | Kawaguchi et al. | |
| 4,868,288 A | 9/1989 | Meier | |
| 4,877,747 A | 10/1989 | Stewart | |
| 4,900,665 A | 2/1990 | Terashima et al. | |

(Continued)

FOREIGN PATENT DOCUMENTS

DE     222 419    5/1985

(Continued)

OTHER PUBLICATIONS

G. Odian, "Principles of Polymerization" Third Edition, John Wiley & Sons Inc., pp. 532-603, New York (1991).

(Continued)

*Primary Examiner*—Walter D Griffin
*Assistant Examiner*—Christine T Mui
(74) *Attorney, Agent, or Firm*—Jean A. Lown

(57) ABSTRACT

Colorimetric sensors comprising a reflective surface and a curable layer are disclosed. Devices comprising the colorimetric sensors and methods of making the sensors and devices are also disclosed. Methods of using the sensors and devices in numerous applications are also disclosed.

24 Claims, 4 Drawing Sheets

U.S. PATENT DOCUMENTS

| | | | |
|---|---|---|---|
| 4,985,340 | A | 1/1991 | Palazzotto et al. |
| 5,073,476 | A | 12/1991 | Meier et al. |
| 5,084,586 | A | 1/1992 | Farooq |
| 5,122,451 | A | 6/1992 | Tanaka et al. |
| 5,124,172 | A | 6/1992 | Burrell et al. |
| 5,124,417 | A | 6/1992 | Farooq |
| 5,218,472 | A | 6/1993 | Jozefowicz et al. |
| 5,393,787 | A | 2/1995 | Nestegard et al. |
| 5,478,527 | A | 12/1995 | Gustafson et al. |
| 5,512,650 | A | 4/1996 | Leir et al. |
| 5,514,728 | A | 5/1996 | Lamanna et al. |
| 5,611,998 | A * | 3/1997 | Aussenegg et al. ........ 422/82.05 |
| 5,639,671 | A | 6/1997 | Bogart et al. |
| 5,670,006 | A | 9/1997 | Wilfong et al. |
| 5,721,289 | A | 2/1998 | Karim et al. |
| 5,869,272 | A | 2/1999 | Bogart et al. |
| 5,877,895 | A | 3/1999 | Shaw et al. |
| 5,882,774 | A | 3/1999 | Jonza et al. |
| 6,007,904 | A | 12/1999 | Schwotzer et al. |
| 6,010,751 | A | 1/2000 | Shaw et al. |
| 6,045,756 | A | 4/2000 | Carr et al. |
| 6,180,318 | B1 | 1/2001 | Fitzer et al. |
| 6,264,747 | B1 | 7/2001 | Shaw et al. |
| RE37,412 | E | 10/2001 | Aussenegg et al. |
| 6,296,927 | B1 | 10/2001 | Jonza et al. |
| 6,312,888 | B1 | 11/2001 | Wong et al. |
| 6,327,031 | B1 | 12/2001 | Gordon |
| 6,396,616 | B1 | 5/2002 | Fitzer et al. |
| 6,492,133 | B1 | 12/2002 | Wickert et al. |
| 6,583,425 | B1 * | 6/2003 | Warner .................... 250/472.1 |
| 6,613,421 | B2 | 9/2003 | Jonza et al. |
| 6,635,337 | B2 | 10/2003 | Jonza et al. |
| 6,664,306 | B2 | 12/2003 | Gaddam et al. |
| 6,949,207 | B2 * | 9/2005 | Jones et al. ................. 252/585 |
| 7,153,651 | B1 | 12/2006 | Drewes et al. |
| 2001/0048072 | A1 | 12/2001 | Painchaud et al. |
| 2002/0168295 | A1 | 11/2002 | Cunningham et al. |
| 2003/0094734 | A1 * | 5/2003 | Deckard et al. ............. 264/425 |
| 2003/0207454 | A1 | 11/2003 | Eyster et al. |
| 2004/0062682 | A1 * | 4/2004 | Rakow et al. ................. 422/55 |
| 2004/0184948 | A1 | 9/2004 | Rakow et al. |

FOREIGN PATENT DOCUMENTS

| | | |
|---|---|---|
| DE | 38 32 185 | 3/1990 |
| EP | 094914 | 11/1983 |
| EP | 109851 | 5/1984 |
| EP | 0 395 300 | 10/1990 |
| EP | 0 665 425 | 8/1995 |
| EP | 0 979 994 | 2/2000 |
| WO | WO 84/03837 | 10/1984 |
| WO | WO 89/06284 | 7/1989 |
| WO | WO 01/21693 | 3/2001 |
| WO | WO 2004/031760 | 4/2004 |
| WO | WO 2005/042771 * | 5/2005 |
| WO | WO 2005/111588 | 11/2005 |

OTHER PUBLICATIONS

"Encyclopedia of Polymer Science and Engineering", Second Edition, H.F. Mark, N. M. Bikales, C.G. Overberger, G. Menges, J. I. Kroschwitz, Eds., vol. 2, 729-814 (1985) John Wiley & Sons, New York.

"Encyclopedia of Polymer Science and Technology", 6, 322 (1986).

Krause et al., "Bicontinuous Nanoporous Polymers by Carbon Dioxide Foaming", *Macromolecules*, vol. 34, pp. 8792-8801 (2001).

Walheim et al., "Nanophase-Separated Polymer Films as High-Performance Antireflection Coatings", *Science*, vol. 283. p. 520 (1999).

Budd et al., "Polymers of Intrinsic Microporosity (PIMs): Robust, Solution-Processable, Organic Nanoporous Materials", *Chem. Comm.*, pp. 230-231 (2004).

U.S. Appl. No. 10/807,655, filed Mar. 24, 2004; Titled: Colorimetric Sensor.

* cited by examiner

COLORIMETRIC SENSORS

TECHNICAL FIELD OF THE INVENTION

The present disclosure relates to colorimetric sensors capable of detecting exposure to radiation and/or thermal energy.

BACKGROUND OF THE INVENTION

The development of radiation and thermal energy sensors remains an important endeavor for applications such as sterilization monitoring, real-time cure monitoring, and radiation and thermal dosimetry. Known radiation and thermal energy sensors either (1) produce a change in color when exposed to radiation or thermal energy due to the presence of one or more photochromic or thermochromic dyes in the sensor or (2) generate a detectable amount of heat (e.g., exotherm) due to chemical reactions that take place within the sensor with the detectable amount of heat being measured via a microprocessor. Among the many methods available for radiation and thermal energy sensing, colorimetric techniques remain advantageous in that the human eye can be used for signal transduction, rather than extensive instrumentation.

Though colorimetric sensors currently exist for detecting exposure to radiation and thermal energy, there exists a need in the art for colorimetric sensors that are based on chemistries other than photochromic or thermochromic dyes to avoid one or more shortcomings associated with photochromic or thermochromic dyes. For example, the response of dyes can have limited tunability so that detecting radiation within certain desired ranges may be a challenge. Further, when using photochromic or thermochromic dyes, a calibration step, as well as a correlation step is necessary to relate a photochromic or thermochromatic dye response to exposure to an amount of UV or heat energy. In addition, potential photobleaching of photochromic dyes is another problem that must be considered with sensors comprising photochromic dyes.

SUMMARY OF THE INVENTION

The present invention features multi-layered colorimetric sensors. The sensors comprise a combination of layers that provide a change in optical properties upon exposure to radiation or thermal energy. For example, the multi-layered colorimetric sensors may comprise a support substrate having a reflective surface or a support substrate having a separate reflective layer thereon, and a curable layer on the reflective surface or layer, wherein the curable layer undergoes a change in one or more optical properties upon exposure to radiation or thermal energy. The multi-layered colorimetric sensors may further comprise one or more additional layers including, but not limited to, a protective layer (e.g., a transparent, clear coat layer) over at least a portion of (or all of) the curable layer, a masking layer over a portion but not all of the curable layer, and combinations thereof.

The multi-layered colorimetric sensors provide a versatile platform for incorporating a variety of chemistries that can detect exposure to radiation or thermal energy. The sensors can be flexible or rigid, and can be designed to provide fast, permanent responses.

A variety of layer configurations and materials may be used to form the colorimetric sensors of the present invention. Each layer provides a desired function to the resulting colorimetric sensor. For example, the reflective layer of the colorimetric sensor may be a substantially continuous layer or a discontinuous layer, and may comprise one or more individual layers. The curable layer may comprise a single or multiple layers containing (a) one or more polymerizable monomers, (b) a functionalized polymer having at least one polymerizable functional group thereon, or (c) a combination thereof. The curable layer may further comprise at least one non-functionalized polymer in combination with (a) one or more polymerizable monomers, (b) a functionalized polymer having at least one polymerizable functional group thereon, or (c) both (a) and (b). The construction and composition of the colorimetric sensors of the present invention will vary depending on a number of factors including, but not limited to, the type and amount of energy being applied, the environment in which the sensor is used, the maximum potential temperature exposure of the sensor, and the desired sensitivity of the sensor.

In one exemplary embodiment, the colorimetric sensor of the present invention comprises a colorimetric sensor for measuring exposure to radiation or thermal energy, wherein the colorimetric sensor comprises a support substrate; a reflective surface on the support substrate; and a curable layer over the reflective surface, the curable layer comprising (a) one or more polymerizable monomers alone or in combination with at least one non-functionalized polymer, (b) a functionalized polymer having at least one polymerizable functional group thereon alone or in combination with at least one non-functionalized polymer, or (c) any combination thereof, wherein the sensor is capable of a change in one or more optical properties upon exposure to (i) a threshold amount of radiation or (ii) a threshold amount of thermal energy. The one or more optical properties may comprise a color (or a lack of color), an optical thickness, a reflectance spectrum value (e.g., a change in the intensity of a reflectance value at a given wavelength or a change in a reflectance peak value from one wavelength to another wavelength), or a combination thereof The present invention is further directed to arrays of sensors. One or more similar or different colorimetric sensors of the present invention may be combined to form an array of sensors capable of providing a composite signal to a user upon exposure to radiation, thermal energy, or both. Such composite signals can provide additional information, such as exposure to and the degree of exposure to both radiation and thermal energy, relative to a signal produced by a single colorimetric sensor. For example, an exemplary array may comprise at least two colorimetric sensors in the array having different curable layer chemistries or different curable layer thicknesses. In another exemplary embodiment, the exemplary array may comprise an array in which each colorimetric sensor in the array (i) shares a common reflective layer and (ii) comprises a stack of layers including (1) a similar or different curable layer, and (2) one or more optional layers selected from an optically clear protective layer, a masking layer, and combinations thereof The present invention is even further directed to a device comprising a colorimetric sensor or array of sensors, a housing component, a device capable of monitoring a change in one or more optical properties of a sensor, or a combination thereof.

The present invention is also directed to methods of detecting exposure of an article to a threshold amount of radiation or thermal energy. In one exemplary embodiment, the method of detecting exposure of an article to a threshold amount of radiation or thermal energy comprises the steps of (i) providing an article; (ii) providing a colorimetric sensor comprising a support substrate; a reflective surface on the support substrate; and a curable layer over the reflective surface, the curable layer comprising (a) one or more polymerizable monomers alone or in combination with at least one non-functionalized polymer, (b) a functionalized polymer having at least one polymerizable functional group thereon alone or in combination with at least one non-functionalized polymer, or (c) any combination thereof, (iii) exposing the article and the sensor to a radiation or thermal energy source, and (iv) monitoring the sensor for a change in one or more optical properties (e.g., a change in color, a change in optical thickness, or a change in reflectance spectrum) resulting from exposure to the threshold amount of radiation or thermal energy. The method may be used in a variety of applications as described below.

The present invention is further directed to methods of measuring an amount of exposure of an article to radiation or thermal energy. In one exemplary embodiment, the method of measuring an amount of exposure of an article to radiation or thermal energy comprises the steps of (i) providing an article; (ii) providing a colorimetric sensor having a first set of optical properties and comprising a support substrate; a reflective surface on the support substrate; and a curable layer over the reflective surface, the curable layer comprising (a) one or more polymerizable monomers alone or in combination with at least one non-functionalized polymer, (b) a functionalized polymer having at least one polymerizable functional group thereon alone or in combination with at least one non-functionalized polymer, or (c) any combination thereof, (iii) exposing the article and the sensor to a radiation or thermal energy source so as to produce a colorimetric sensor having a second set of optical properties, and (iv) comparing the second set of optical properties to the first set of optical properties.

The present invention is even further directed to methods of tailoring a colorimetric sensor to exhibit a change in one or more optical properties (e.g., a change in color, a change in optical thickness, or a change in reflectance spectrum) upon exposure to a predetermined amount of radiation or thermal energy. In one exemplary embodiment, the method of tailoring a colorimetric sensor to exhibit a change in one or more optical properties upon exposure to a predetermined amount of radiation or thermal energy comprises the steps of (1) choosing a specific amount of radiation or thermal energy; (2) formulating a curable composition that exhibits a change in one or more optical properties when (i) applied over a reflective surface at a curable layer thickness, and (ii) subsequently exposed to the specific amount of radiation or thermal energy; (3) providing a support substrate having a reflective surface thereon; and (4) applying the curable composition over the reflective surface so as to form a curable layer having the curable layer thickness. In this method, the curable composition may comprise (a) one or more polymerizable monomers alone or in combination with at least one non-functionalized polymer, (b) a functionalized polymer having at least one polymerizable functional group thereon alone or in combination with at least one non-functionalized polymer, or (c) any combination thereof.

Other features and advantages of the invention will be apparent from the following drawings, detailed description, and claims.

DETAILED DESCRIPTION OF THE INVENTION

The present invention is directed to multi-layered (ML) sensors that exhibit interference-based optical property (e.g., color) changes upon exposure to radiation or thermal energy. The color (and other optical properties) of the ML sensor is governed by the optical thickness of a curable layer of the sensor according to the equation:

$$2nd(\cos \alpha) = (m - \tfrac{1}{2})\lambda$$

where n is the refractive index of the curable layer material, d is the thickness of the curable layer, the product of n and d is the optical thickness, $\alpha$ is the incident viewing angle, m is the optical order number and $\lambda$ is the wavelength in nanometers (nm). Upon exposure to radiation or thermal energy, the curable layer of the sensor undergoes a change in thickness (due to shrinkage) and/or refractive index. If the changes are large enough, the ML sensor undergoes a color change. Through manipulation of the composition and thickness of the curable layer, the curable layer may be tailored to exhibit a color change at a desired dosage of radiation or thermal energy. In addition, spectroscopic analysis of the sensor enables quantitative determination of the amount of radiation or thermal energy exposure.

The multi-layered colorimetric sensors of the present invention comprise at least one curable layer over a reflective surface of a support substrate. In some embodiments, the reflective surface may be an outer surface of the support substrate. In other embodiments, the reflective surface may be an outer surface of a reflective layer separate from and positioned on or over the support substrate. The multi-layered colorimetric sensors of the present invention may further comprise one or more additional layers as described below.

Figure 1:
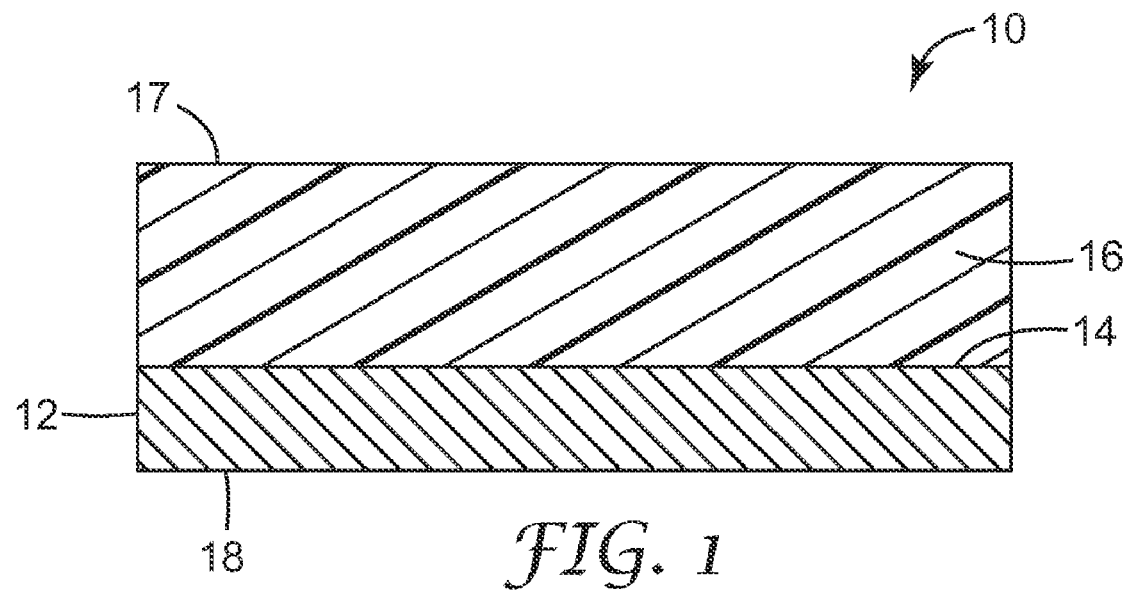
FIG. 1 depicts an exemplary multi-layered colorimetric sensor of the present invention.

One exemplary multi-layered colorimetric sensor of the present invention is shown in FIG. 1. As shown in FIG. 1, exemplary multi-layered colorimetric sensor 10 comprises support substrate 12 having reflective surface 14 thereon, and curable layer 16. Curable layer 16 may be exposed to an environment so that curable layer 16 provides an optical signal to (i) a user so as to be viewable through outer surface 17, or (ii) a device capable of monitoring a change in an optical property (e.g., color) of sensor 10. In other embodiments, at least a portion of outer surface 17 is covered with one or more additional layers (e.g., a clear coat protective layer, a masking layer, or both) such that the optical signal is viewable through a portion of outer surface 17. Such embodiments are shown in FIGS. 2-3.

Figure 2:
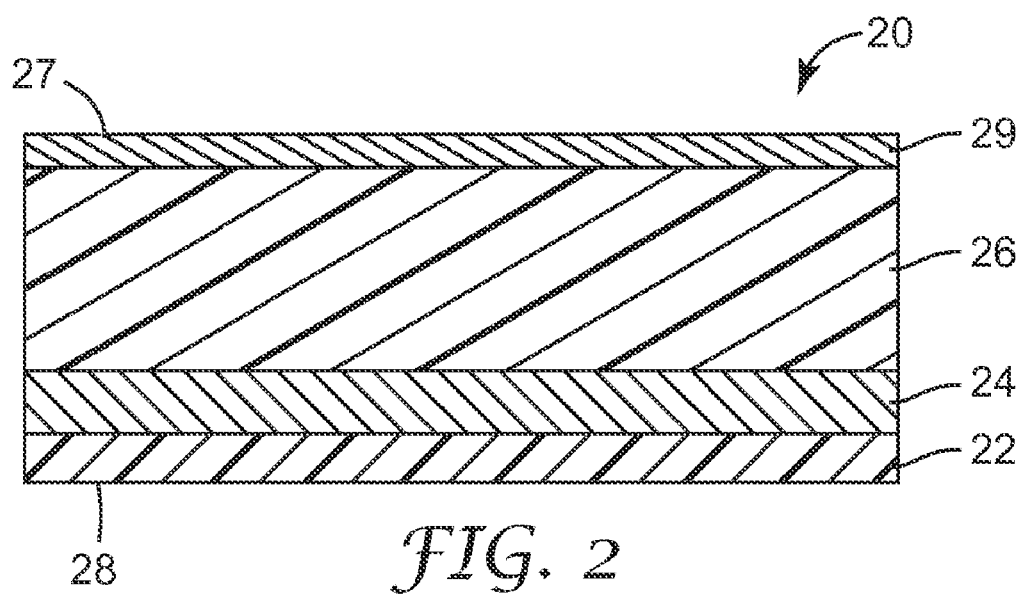
FIG. 2 depicts another exemplary multi-layered colorimetric sensor of the present invention.
Figure 3:
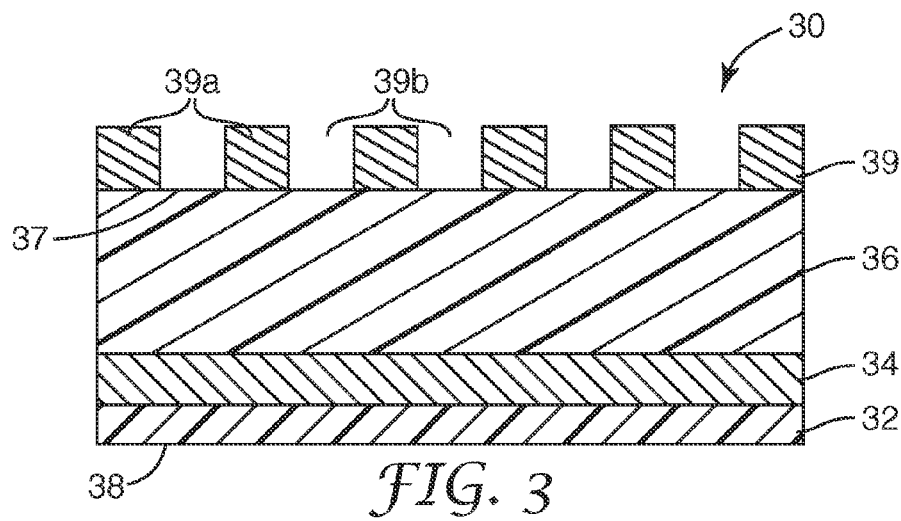
FIG. 3 depicts another exemplary multi-layered colorimetric sensor of the present invention.
Figures 4A, 4B, 4C:
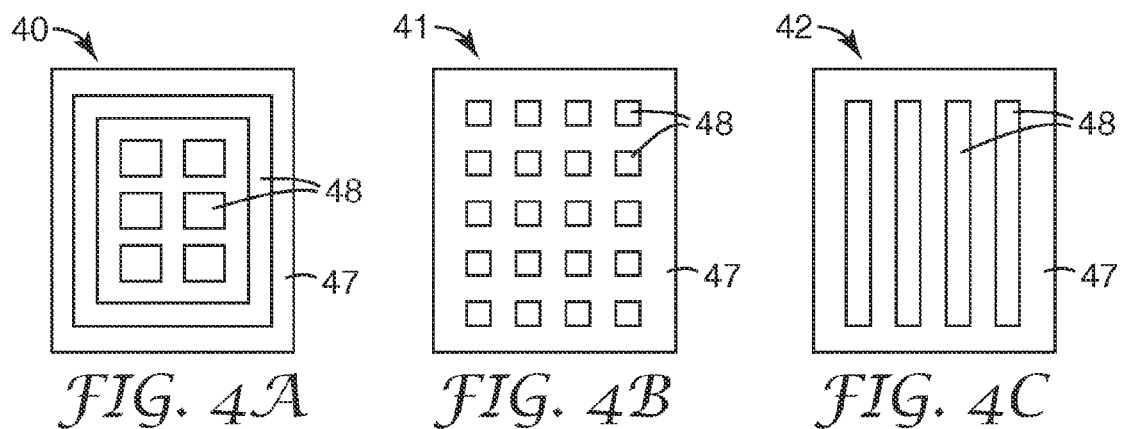
FIGS. 4A-4F depict frontal views of exemplary arrays of multi-layered film sensors of the present invention.
Figures 4D, 4E, 4F:
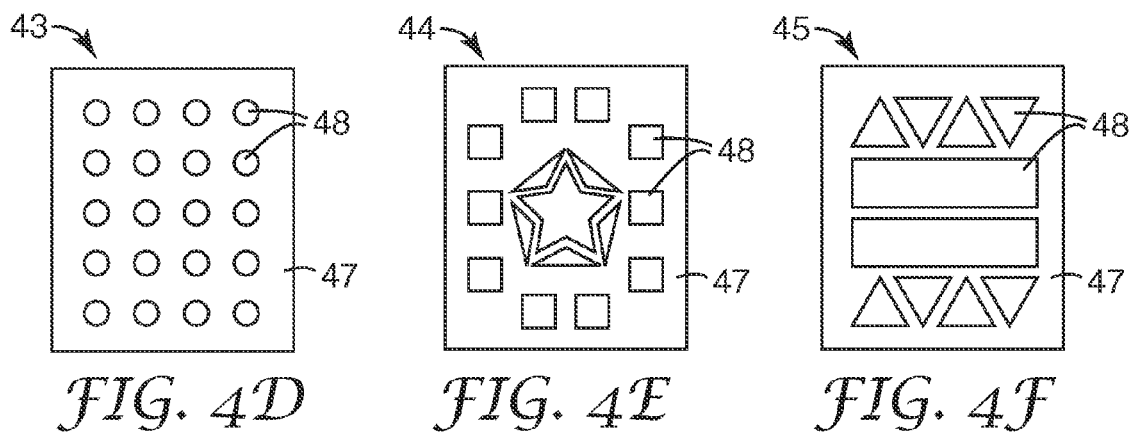

As shown in FIG. 2, exemplary multi-layered colorimetric sensor 20 comprises support substrate 22, reflective layer 24, curable layer 26, and protective layer 29 over outer surface 27 of curable layer 26. In this exemplary embodiment, protective layer 29 covers the entire outer surface 27 of curable layer 26. In FIG. 3, exemplary multi-layered colorimetric sensor 30 comprises support substrate 32, reflective layer 34, curable layer 36, and masking layer 39 over a portion of outer surface 37 of curable layer 36. In this exemplary embodiment, portions 39a of masking layer 39 cover portions of outer surface 37, while open areas 39b within masking layer 39 provide a view of outer surface 37.

A number of terms are used in the present invention to describe the disclosed multi-layered colorimetric sensors. Some terms are provided below. As used in the present invention:

"optically flat" refers to a support substrate that has a minimal amount of curvature and/or specular reflectance of at least 25% of incident light (more preferably, at least 50% of incident light);

"dimensional change" means a change of distance in a direction normal to the outer surface of the curable layer surface;

"reflective" means semi-reflective or fully reflective;

"non-functionalized" refers to a polymer that does not contain crosslinkable or polymerizable functional groups thereon;

"functionalized" refers to a polymer that contains at least one reactive, crosslinkable or polymerizable functional group thereon;

"(meth)acrylate" refers to both acrylates and methacrylates; and

"low volatility" refers to polymerizable monomers having a boiling point of above about 150° C. at 1 atm.

The multi-layered colorimetric sensor may be used to detect exposure of an article to radiation or thermal energy. The multi-layered colorimetric sensor may further be used to measure an amount or degree of exposure of an article to radiation or thermal energy. In at least one embodiment, exposure of an article to radiation or thermal energy is detected by a change in the optical thickness of the curable layer upon exposure to radiation or thermal energy. A given article and sensor positioned proximate the article is exposed to radiation or thermal energy, which changes the optical thickness of the curable layer.

The change in optical thickness is typically observable in the visible light range and can be detected by the unaided human eye, in some embodiments, due to the chemical composition of the curable layer. However, sensors can be designed to show a change in optical thickness when subjected to other light sources such as UV, infrared, or near infrared. Various detection mechanisms can also be used. Examples of suitable detection mechanisms include spectrophotometers, fiber optic spectrophotometers, and photo-detectors, e.g., charge coupled devices (ccd), digital cameras, etc.

As shown in FIGS. 1-3 above, the multi-layered colorimetric sensors of the present invention may comprise a number of individual components. A description of each component, as well as optional components, is provided below.

I. Multi-layered Colorimetric Sensors

The multi-layered colorimetric sensors of the present invention comprise one or more of the following components:

A. Support Substrate

The multi-layered colorimetric sensors of the present invention comprise a support substrate such as support substrate 12 of exemplary multi-layered colorimetric sensor 10 shown in FIG. 1. The support substrate may comprise any suitable material capable of providing support for the curable layer of the colorimetric sensors. The support substrate may be flexible or non-flexible (e.g., rigid), and may be tailored for a given application. In one desired embodiment, the support substrate is suitable for use in a vacuum deposition process so as to provide a reflective layer on the support substrate when needed. In a further desired embodiment, the support substrate comprises an optically flat substrate.

Suitable materials for forming the support substrate include, but are not limited to, a polymer film or sheet (e.g., a polyethylene terephthalate (PET) film), a glass substrate, an inorganic substrate, a ceramic substrate, a silicon wafer, a fabric sheet, or any combination thereof. In one exemplary embodiment, the support substrate comprises a reflective surface such that an additional reflective layer is not necessary on the support substrate. One such support substrate is a silicon wafer. Another such support substrate is an all-polymeric mirror film, onto which the curable layer (described below) can be deposited. Exemplary all-polymeric mirror films are disclosed in U.S. Pat. Nos. 6,635,337; 6,613,421; 6,296,927; and 5,882,774, the subject matter of which is hereby incorporated by reference in its entirety.

In a further exemplary embodiment, the support substrate comprises a flexible substrate such as a polymer film or sheet having little or no reflectivity. Since the polymer film or sheet does not have a reflective surface thereon, a reflective layer (e.g., a metallic or semi-metallic layer, described below) is provided on the support substrate in this exemplary embodiment.

The support substrate may have a thickness that varies depending on a given application. Typically, the support substrate has a thickness of at least about 50 micrometers (µm), and typically, from about 50 µm to about 25 millimeters (mm), however, the support substrate can have any desired thickness.

The support substrate can have an outer surface (e.g., outer surface 18 shown in FIG. 1, outer surface 28 shown in FIG. 2, and outer surface 38 shown in FIG. 3) that enables attachment of the sensor to a given article directly or indirectly via one or more additional layers suitable for bonding the sensor to a given article (e.g., a pressure sensitive adhesive layer).

B. Reflective Surface

The multi-layered colorimetric sensors of the present invention also comprise a reflective surface such as reflective surface 14 of exemplary multi-layered colorimetric sensor 10 shown in FIG. 1. As discussed above, the reflective surface may be an outer reflective surface of the support substrate (e.g., reflective surface 14 of support substrate 12 shown in FIG. 1) or may be a separate layer over an outer surface of the support substrate (e.g., reflective layer 24 over support substrate 22 shown in FIG. 2).

The reflective surface may comprise any material that can form a reflective surface. Suitable materials for the reflective surface include, but are not limited to, metals or semi-metals such as aluminum, chromium, gold, palladium, platinum, titanium, nickel, silicon, silver, and combinations thereof. Alloys such as Au/Pd or Ni/Cr may also be used. Other suitable materials include, but are not limited to, metal oxides such as silicon oxide, chromium oxide, titanium oxide, and combinations thereof with or without one or more suitable metals or semi-metals.

Desirably, the material used to form the reflective surface or the reflective layer is fully reflective at a layer thickness (e.g., support layer or reflective layer) of from about 20 to about 200 nm. Thinner layers may be used to make the reflective surface or the reflective layer semi-reflective. When present as a separate reflective layer, the reflective surface typically has an average reflective layer thickness of at least about 5 nm (up to any desired thickness). When present as a layer separate from the support substrate, the reflective layer typically has an average reflective layer thickness of from about 20 nm to about 200 nm, and more typically, from about 25 nm to about 100 nm.

In some exemplary embodiments of the present invention, the reflective surface is at least about 90% reflective (i.e., at least about 10% transmissive), and in some embodiments, about 99% reflective (i.e., about 1% transmissive). In other exemplary embodiments of the present invention, the reflective surface is semi-reflective, wherein the reflective surface is at least about 20% reflective, desirably, about 20 to about 90% reflective, and even more desirably, about 30 to about 70% reflective.

The reflective surface may be a substantially continuous reflective surface or a discontinuous reflective surface. Further, the reflective surface may comprise one or more reflective layers. Desirably, the reflective surface comprises a single, continuous reflective surface forming an outer surface of the support substrate or a single, continuous reflective layer on an outer surface of the support substrate.

C. Curable Layer

The multi-layered colorimetric sensors of the present invention further comprise a curable layer such as curable layer 16 of exemplary multi-layered colorimetric sensor 10 shown in FIG. 1. The curable layer may comprise a variety of materials including, but not limited to, (a) one or more polymerizable monomers alone or in combination with at least one non-functionalized polymer, (b) a functionalized polymer having at least one polymerizable functional group thereon alone or in combination with at least one non-functionalized polymer, or (c) any combination thereof In one exemplary embodiment, the curable layer comprises one or more polymerizable monomers. Such monomers include free-radically polymerizable monomers, cationically polymerizable monomers, bi-functional monomers, or any combination thereof. The choice of desired polymerizable monomers is dependent on a number of factors including, but not limited to, the application for the sensor, the potential temperature exposure of the sensor, the energy source, etc. Desirably, the one or more polymerizable monomers (i) can be coated from solution into a thin film on the above-described reflective surface or reflective layer, (ii) comprise "low volatility" polymerizable monomers, or (iii) both (i) and (ii).

Suitable free-radically polymerizable monomers for use in the present invention include, but are not limited to, the following classes of monomers:

Class A—(meth)acrylic acid esters of an alkyl alcohol (desirably a non-tertiary alcohol), the alcohol containing from 1 to 22 (desirably from 4 to 22) carbon atoms and include, for example, methyl(meth)acrylate, ethyl(meth) acrylate, n-butyl(meth)acrylate, t-butyl(meth)acrylate, hexyl (meth)acrylate, isooctyl(meth)acrylate, 2-ethylhexyl (meth) acrylate, isononyl(meth)acrylate, isobornyl(meth)acrylate, phenoxyethyl (meth)acrylate, decyl(meth)acrylate, dodecyl (meth)acrylate and stearyl(meth)acrylate;

Class B—(meth)acrylic acid monoesters of polyhydroxy alkyl alcohols such as 1,2-ethanediol, 1,2-propanediol, 1,3-propane diol, the various butyl diols, the various hexanediols, glycerol acrylate, such that the resulting esters are referred to as hydroxyalkyl (meth)acrylates;

Class C—multifunctional monomers, such as 1,4-butanediol diacrylate, 1,6-hexanediol diacrylate, glycerol diacrylate, glycerol triacrylate, neopentyl glycol diacrylate, ethyleneglycol diacrylate, diethyleneglycol diacrylate, triethyleneglycol diacrylate, 1,3-propanediol di(meth)acrylate, trimethylolpropane triacrylate, 1,2,4-butanetriol tri (meth)acrylate, 1,4-cyclohexanediol diacrylate, pentaerythritol triacrylate, pentaerythritol tetra(meth)acrylate, sorbitol hexaacrylate dipropylene glycol di(meth)acrylate, 1,3-butylene glycol di(meth)acrylate, propoxylated (3) trimethylolpropane tri(meth)acrylate, di-trimethylolpropane tetra(meth) acrylate, dipentaerythritol penta(meth)acrylate, tris-hydroxyethyl-isocyanurate tri(meth)acrylate, bis-(meth) acrylates of polyethylene glycol having an number average molecular weight greater than 200, methylene bis-arylamide, methylene bis-(meth)acrylamide, 1,6-hexamethylene bis-(meth)acrylamide, diethylene triamine tris-(meth)acrylamide, beta-(meth)acrylaminoethyl(meth)acrylate, diallyl phthalate, divinyl succinate, divinyl adipate, divinylphthalate, ethoxylated (6) bisphenol A dimethacrylate (BisEMA6), bisphenol A diglycidyl dimethacrylate (bisGMA), urethane dimethacrylate (UDMA) and neopentyl glycol dimethacrylate (NPGDMA);

Class D—macromeric(meth)acrylates, such as (meth) acrylate-terminated styrene oligomers, (meth)acrylate-terminated siloxane oligomers, and (meth)acrylate-terminated polyethers, such as are described in PCT Patent Application WO 84/03837 and European Patent Application EP 140941;

Class E—(meth)acrylic acids and their salts with alkali metals, including, for example, lithium, sodium, and potassium, and their salts with alkaline earth metals, including, for example, magnesium, calcium, strontium, and barium;

Class F—nitrogen-bearing monomers selected from the group consisting of (meth)acrylonitrile, (meth)acrylamide, N-substituted (meth)acrylamides, N,N-disubstituted (meth) acrylamides, the latter of which may include substituents of 5-and 6-membered heterocyclic rings comprising one or more heteroatoms, and methyl-substituted maleonitrile, and N-vinyl lactams, such as N-vinyl pyrrolidinone and N-vinyl caprolactam; and Class G—photoinitator monomers such as those disclosed in U.S. Pat. No. 6,664,306, issued to 3M Company (St. Paul, Minn.), the subject matter of which is incorporated herein by reference in its entirety.

Suitable cationically polymerizable monomers typically contain at least one cationically polymerizable group such as epoxides, cyclic ethers, vinyl ethers, side-chain unsaturated aromatic hydrocarbons, lactones and other cyclic esters, cyclic carbonates, cyclic acetals, aldehydes, cyclosiloxanes, cyclotriphosphazenes and mixtures thereof. Other suitable cationically polymerizable groups or monomers are described in G. Odian, "Principles of Polymerization" Third Edition, John Wiley & Sons In., New York (1991) and "Encyclopedia of Polymer Science and Engineering", Second Edition, H. F. Mark, N. M. Bikales, C. G. Overberger, G. Menges, J. I. Kroschwitz, Eds., Vol. 2, 729-814 (1985) John Wiley & Sons, New York.

In one exemplary embodiment, the one or more polymerizable monomers comprise at least one cationically polymerizable group comprising an epoxide or a vinyl ether. Epoxy compounds that can be used in this invention are those known to undergo cationic polymerization and include 1,2-, 1,3-, and 1,4-cyclic ethers (also designated as 1,2-, 1,3-, and 1,4-epoxides). Such epoxy compounds are disclosed in the "Encyclopedia of Polymer Science and Technology", 6, 322 (1986). When preparing compositions containing epoxy monomers, other components including, but not limited to, hydroxy-functional materials can be added to the composition. The hydroxyl-functional materials can be present as a mixture or a blend of materials and can contain mono-and polyhydroxyl containing materials. When present, the hydroxy-functional material desirably comprises at least two hydroxyl groups (e.g., a diol). Further, when present, the one or more epoxy resins and the one or more mono-and/or polyhydroxyl-containing materials can be present in any desired weight ratios, and are each typically present in an amount ranging from about 5 to about 95% by weight of the curable layer.

In a further exemplary embodiment, the one or more polymerizable monomers comprise one or more epoxy resins blended with one or more vinyl ether resins. In this embodiment, the one or more epoxy resins and the one or more vinyl ether resins can be present in any desired weight ratios, and are each typically present in an amount ranging from about 5 to about 95% by weight of the curable layer.

Bi-functional polymerizable monomers having both cationically polymerizable and free-radically polymerizable moieties in the same monomer are also useful in the present invention, such as, for example, glycidyl methacrylate and 2-hydroxyethyl acrylate. Such bi-functional polymerizable monomers may be used alone or in combination with one or more of the above-described polymerizable monomers. In one exemplary embodiment, a free radically polymerizable monomer, such as one of the above-described (meth)acrylates, is combined with one or more bi-functional polymerizable monomers to form a curable layer.

In one exemplary embodiment, the curable layer comprises a single polymerizable monomer. In other exemplary embodiments, the curable layer comprises a mixture of two or more polymerizable monomers. When a mixture of polymerizable monomers is used to form the curable layer, each monomer can be present in any amount, and is typically present in an amount ranging from about 5 to about 95% by weight of the curable layer.

The curable layer may comprise one or more of the above-mentioned polymerizable monomers either alone or in combination with at least one oligomer, at least one polymer, or a combination thereof. In one exemplary embodiment, the curable layer comprises one or more of the above-mentioned polymerizable monomers in combination with at least one non-functionalized polymer. Suitable non-functionalized polymers for use with the above-described polymerizable monomers may be selected based on a number of factors including, but not limited to, the particular application in which the sensor is to be used, the other components of the curable layer, etc.

In some embodiments, it may be desirable for the curable layer to be hydrophobic so as to reduce the chance that ambient moisture or water will cause a change in optical thickness of the curable layer and potentially interfere with the detection of radiation and/or thermal energy and/or potentially interfere with any signal indicating exposure to radiation and/or thermal energy. In these embodiments, the non-functionalized polymers desirably include, but are not limited to, polymers and copolymers (including block copolymers) prepared from classes of monomers including hydrophobic acrylates and methacrylates; multifunctional monomers such as divinylbenzene, 1,6-hexanediol di(meth)acrylate, trimethylol propane di(meth)acrylate, neopentyl glycol di(meth)acrylate, poly(dimethylsiloxane)di(meth)acrylate, diacrylates such as those commercially available from UCB Chemicals under the trade designation "IRR 214", pentaerythritol tri- and tetra-acrylate, and trimethylol propane tri(meth)acrylate; vinyl monomers such as styrene, alpha-methylstyrene, vinylacetate, vinylbutyrate, vinylstearate, vinylchloride, and vinyl norbornene; hydrocarbon monomers (olefins) such as isobutylene, ethylene, propylene, butadiene, and norbornene; silane monomers such as organohydrosilanes, alkoxysilanes, phenoxysilanes, and fluoroalkoxysilanes; and fluorinated monomers such as tetrafluoroethylene, vinylidene fluoride, hexafluoropropylene, and perfluoroalkyl(meth)acrylates.

In other embodiments where ambient moisture and water are not a concern, non-functional polymers desirably include, but are not limited to, polymers and copolymers (including block copolymers) prepared from classes of monomers including hydroxylated monomers including hydroxyalkyl (meth)acrylates such as hydroxyethyl(meth)acrylate and hydroxymethyl(meth)acrylate; acrylamides such as (meth) acrylamide, N-isopropyl(meth)acrylamide, and N,N-dimethyl(meth)acrylamide; anhydrides such as (meth)acrylic anhydride and maleic anhydride; aldehyde-functionalized monomers such as acrolein; amine or amine salt functionalized monomers such as t-butylaminoethyl(meth)acrylate, diisopropylaminoethyl(meth)acrylate, dimethylaminoethyl (meth)acrylate, vinylpyridine, dimethylaminoethyl(meth) acrylate-methyl chloride salt, aminostyrene, 4-aminostyrene, and vinylimidazole; acid-functionalized monomers such as (meth)acrylic acid, carboxyethyl(meth)acrylate, (meth) acrylic acid-metal salts, styrene sulfonic acid, monomers commercially available from UCB Chemicals under the trade designation "EBECRYL 170", vinylphosphonic acid, and vinylsulfonic acid; epoxide-functionalized monomers such as glycidyl(meth)acrylate; vinyl monomers such as N-vinylpyrrolidone, vinyldimethylazalactone (VDM), vinylidene chloride, vinylalcohol, (meth)acrylonitrile, and vinylphenol; and the bi-functional monomers listed above.

Examples of other non-functional polymers suitable for use in the present invention include, but are not limited to, poly(caprolactone), poly(sulfone), poly(ethylene glycol), poly(urethanes), poly(carbonate), poly(ethyleneimine), poly (vinyl alcohol), poly(vinyl phenol), ethyl cellulose, fluoropolyol, polyesters, polyamides, polyimides and polyacetals.

When a mixture of polymerizable monomer(s) and at least one non-functionalized polymer is used to form the curable layer, the polymerizable monomer(s) component is typically present in an amount ranging from about 5 to about 95% by weight, more desirably from about 10 to about 50% by weight, and even more desirably from about 10 to about 30% by weight, while the non-functionalized polymer(s) component is typically present in an amount ranging from about 5 to about 95% by weight, more desirably from about 50 to about 90% by weight, and even more desirably from about 70 to about 90% by weight, wherein all percents by weight are based on a total weight of the curable layer.

In further exemplary embodiments, the curable layer comprises a functionalized polymer having at least one reactive functional group thereon, wherein the at least one reactive functional group is capable of (i) reacting with another component within the curable layer (separate from the functionalized polymer), (ii) cross-linking with another functional group on the functionalized polymer or with another component within the curable layer (separate from the functionalized polymer), or (iii) both (i) and (ii). Exemplary reactive functional groups include, but are not limited to, pendant groups that contain free-radically polymerizable unsaturation (e.g., vinyl, vinyloxy, (meth)acrylic, (meth)acryloyl, (meth) acryloxy, propargyl, (meth)acrylamido groups, and acetylenic functional groups); and reactive groups capable of undergoing a nucleophilic/electrophilic reaction such as hydroxyl, secondary amino, oxazolinyl, oxazolonyl, acetyl, acetonyl, carboxyl, isocyanato, epoxy, aziridinyl, acyl halide, vinyloxy, and cyclic anhydride groups.

Suitable functionalized polymers include, but are not limited to, polymers having free-radically polymerizable groups thereon, polymers having cationically polymerizable groups thereon, or both. Suitable functionalized polymers for use in the present invention include, but are not limited to, functionalized polymers disclosed in U.S. Pat. No. 6,664,306. Of particular interest in the present invention are the functionalized polymers disclosed in U.S. Pat. No. 6,664,306, which are formed by the "indirect" process (i.e., the formation of functionalized polymers via a reaction between (i) a polymer containing one or more functional groups thereon and (ii) one or more bi-functional reactants having at least one reactive group thereon that reacts with the one or more functional groups on the polymer and a free-radically polymerizable unsaturated group). In addition, the functionalized polymers of the present invention include the "polyfunctional compounds" disclosed in U.S. Pat. No. 6,664,306 such as the disclosed dentritic polymers, as well as the photoinitiator polymers disclosed in U.S. Pat. No. 6,664,306.

Other functionalized polymers suitable for use in the present invention include, but are not limited to, ethylene/carbon monoxide polymers commercially available from DuPont (Wilmington, Del.) under the trade designation "ELVALOY", resins (e.g., terpolymers of ethylene, vinyl acetate and carbon monoxide (E/VA/CO)), and "ELVALOY HP" resins (e.g., terpolymers of ethylene, butyl acrylate and carbon monoxide (E/nBA/CO)).

In these embodiments, the curable layer may comprise up to 100% by weight of one or more functionalized polymers or may comprise one or more functionalized polymers in combination with one or more of the above-described polymerizable monomers, one or more of the above-described non-functionalized polymer, or both.

In some embodiments, the curable layer may comprise (a) at least one functionalized polymer in combination with at least one polymerizable monomer, (b) at least one non-functionalized polymer, or (c) a combination thereof When a mixture of at least one functionalized polymer with at least one polymerizable monomer and/or at least one non-functionalized polymer is used to form the curable layer, the functionalized polymer(s) component is typically present in an amount ranging from about 5 to about 95% by weight, more typically from about 50 to about 90% by weight, and even more typically from about 70 to about 90% by weight; the polymerizable monomer(s) component is typically present in an amount ranging from about 5 to about 95% by weight, more typically from about 10 to about 50% by weight, and even more typically from about 10 to about 30% by weight; and the non-functionalized polymer(s) component is typically present in an amount ranging from about 5 to about 95% by weight, more typically from about 50 to about 90% by weight, and even more typically from about 70 to about 90% by weight, wherein all percents by weight are based on a total weight of the curable layer.

The curable layer typically further comprises at least one polymerization initiator. Suitable polymerization initiators include photoinitiators, thermal initiators, or a combination thereof. Thermal free radical initiators useful in the present invention include, but are not limited to, azo, peroxide, persulfate, and redox initiators. Exemplary azo, peroxide, persulfate, and redox initiators suitable for use in the present invention are disclosed in U.S. Pat. No. 5,721,289, which is issued to 3M Company (St. Paul, Minn.), the subject matter of which is incorporated herein by reference in its entirety.

Suitable commercially available thermal initiators are those available under the trade designation "VAZO" from E. I. duPont de Nemours & Co. (Wilmington, Del.) and include 2,2'-azobis(2-methylbutyronitrile) (VAZO-67) and 2,2'-azobis(2,4-dimethylvaleronitrile) (VAZO-52). Other suitable thermal initiators include, but are not limited to, benzoyl peroxide, cumene hydroperoxide, di-t-butyl peroxide and diisopropyl peroxydicarbonate.

Other suitable initiators include, but are not limited to, pinacols, such as tetraphenyl 1,1,2,2-ethanediol; the benzoin ethers, such as benzoin methyl ether or benzoin isopropyl ether; substituted benzoin ethers, such as anisoin methyl ether; substituted acetophenones, such as 2,2-diethoxyacetophenone and 2,2-dimethoxy-2-phenylacetophenone; substituted alpha-ketols, such as 2-methyl-2-hydroxypropiophenone; aromatic sulfonyl chlorides, such as 2-naphthalenesulfonyl chloride; and photoactive oximes, such as 1-phenyl-1,2-propanedione-2(O-ethoxycarbonyl)oxime.

Photoinitiators suitable for use with cationically curable monomers comprise the class of salts having the formula:

$$ZY$$

where Z is the cationic portion and Y is the anionic portion of the initiator, the amount of Z and Y being such that the initiator compound is electrically neutral. Classes of cations, Z, useful as the cationic portion of the catalysts and initiators include:

(1) mono-or polyvalent metal cations desirably having a valence of 1-5 selected from the group consisting of metals of Groups IA-IIIA, IB-VIIB, VIII and those of the lanthanide and actinide series of the Periodic Table of the Elements (CAS Version);

(2) organic onium cations, for example those described in U.S. Pat. Nos. 4,250,311, 3,708,296, 4,069,055, 4,216,288, 5,084,586 and 5,124,417, the subject matter of which is incorporated herein by reference, including aliphatic or aromatic Group IVA-VIIA (CAS version) centered onium salts and desirably selected from diazonium, sulfoxonium, diaryliodonium, triarylsulfonium, and protonated aliphatic, aromatic or heterocyclic amines; and (3) organometallic complex cations essentially free of metal hydride or metal alkyl functionality selected from those described in U.S. Pat. No. 4,985,340, the subject matter of which is incorporated herein by reference, and has the formula:

$$[(L1)(L2)M]^{+q}Y_n$$

wherein:

M represents a metal selected from the group consisting of Cr, Mo, W, Mn Re, Fe, Ru, Os, Co, Rh, Ir, Pd, Pt and Ni;

L1 represents 1 or 2 cyclic, polyunsaturated ligands that can be the same or different ligand selected from the group consisting of substituted and unsubstituted cyclopentadienyl, cyclohexadienyl, and cycloheptatrienyl, cycloheptatriene, cyclooctatetraene, heterocyclic compounds and aromatic compounds selected from substituted or unsubstituted benzene compounds and compounds having 2 to 4 fused rings, each capable of contributing 3 to 8 electrons to the valence shell of M;

L2 represents none, or 1 to 3 nonanionic ligands contributing an even number of electrons that can be the same or different ligand selected from the group of carbon monoxide, ketones, olefins, ethers, nitrosonium, phosphines, phosphites, and related derivatives of arsenic and antimony organonitriles, amines, alkynes, isonitriles, dinitrogen, with the proviso that the total electronic charge contributed to M results in a net residual positive charge of q to the complex;

q is an integer having a value of 1 or 2, the residual charge of the complex cation;

Y is the anion; and n is an integer having a value of 1 or 2, the number of complex anions required to neutralize the charge q on the complex cation.

Organometallic salts are known in the art and can be prepared as described in, for example, European Patent Nos. 109,851, 094,914, 094,915 and 126,712, the subject matter of which is incorporated herein by reference in their entirety.

The anion, Y, comprises the class of anions of the type

XQ, where X is an element selected from B, P, As or Sb, and Q is F or a F substituted aromatic compound, the ratio of X to Q selected to give the moiety an overall negative charge.

Other suitable initiators for use in the present invention include, but are not limited to, initiators disclosed in U.S. Pat. Nos. 5,514,728 and 5,670,006, the subject matter of which is incorporated herein by reference in their entirety.

Suitable commercially available photoinitiators include, but are not limited to, those available under the trade designations "IRGACURE" and "DAROCUR" from Ciba Specialty Chemical Corp., Tarrytown, N.Y. and include 1-hydroxy cyclohexyl phenyl ketone (IRGACURE 184), 2,2-dimethoxy-1,2-diphenylethan-1-one (IRGACURE 651), bis(2,4,6-trimethylbenzoyl)phenylphosphineoxide (IRGACURE 819), 1-[4-(2-hydroxyethoxy)phenyl]-2-hydroxy-2-methyl-1-propane-1-one (IRGACURE 2959), 2-benzyl-2-dimethylamino-10(4-morpholinophenyl)butanone (IRGACURE 369), 2-methyl-1-[4-(methylthio)phenyl]-2-morpholinopropan-1-one (IRGACURE 907) and 2-hydroxy-2-methyl-1-phenyl propan-1-one (DAROCUR 1173). Suitable photoinitiators may further comprise multiple components such as diphenyl iodonium hexafluorophosphate with (4-dimethylamino)benzophenone.

When present, the polymerization initiator(s) is typically present in an amount of about 0.001 to about 5.0% by weight, more typically from about 0.05 to about 3.0% by weight, and even more typically from about 0.1 to about 2.0% by weight based on a total weight of the curable layer.

In some exemplary embodiments, the curable layer comprises a blend or combination of one or more of the above-described components. The blend may be homogeneous or heterogeneous. The blend or combination of one or more of the above-described components in the curable layer allows for detection of various amounts of radiation, thermal energy, or both with the use of a single, relatively small sensor. In one exemplary embodiment, the curable layer comprises at least two of the above-described components, wherein the components are (1) blended with one another, (2) within a given layer but not blended with one another (i.e., in a side-by-side configuration), (3) in a layer separate from one another (i.e., in a stack), or (4) any combination of (1) to (3).

The curable layer comprises one or more of the above-described materials so as to form a curable composition having an optical thickness that changes upon exposure to radiation or thermal energy. The change in optical thickness can be caused by a dimensional change such as a change in physical thickness of the curable composition due to swelling or shrinkage or a change in refractive index of the curable composition. The change in optical thickness can result in a color change in the curable layer. For example, the curable layer may change from one color to another, from a color to no color, or from no color to a color. In one exemplary embodiment, the sensor of the present invention either displays a first color or is colorless when viewed through the curable layer, and when exposed to a threshold amount of radiation or thermal energy either (i) undergoes a color change from the first color to a second color (i.e., different from the first color), (ii) undergoes a color change from the first color to a colorless condition, or (iii) undergoes a color change from a colorless state to a color-containing state.

Like the reflective surface (or layer), the curable layer may comprise one or more layers. The curable layer may also comprise two or more sub-layers. One or more of the sub-layers may be discontinuous or patterned. The sub-layers, when present, typically comprise different compositional materials having different degrees of sensitivity to radiation or thermal energy exposure. The sub-layers may have a variety of configurations. For example, the sub-layers may be stacked to form a stack of two or more layers or may be positioned within the same layer in a side-by-side configuration.

The curable layer may comprise a pattern so as to create colored images, words, or messages upon exposure to radiation or thermal energy. A sub-layer may be patterned by having one or more portions that are sensitive to radiation, thermal energy, or both (i.e., experiences a dimensional change upon exposure to radiation, thermal energy, or both) and one or more portions that are insensitive to radiation or thermal energy exposure (i.e., do not experience a dimensional change upon exposure to radiation or thermal energy). Alternatively, a pattern of exposure-sensitive material may be deposited on a larger exposure-insensitive sub-layer. In this later embodiment, it is desirable to make the patterned layer very thin so that no difference in optical thickness is apparent until the sensor is exposed to radiation or thermal energy. The patterning can provide an easily identifiable signal to a user (or device) upon exposure to radiation or thermal energy.

The curable layer can have any desired overall thickness. Desirably, the curable layer has an overall thickness of more than about 50 nm, more desirably, in the range of about 100 to about 2000 nm, and even more desirably, in the range of about 200 to about 1400 nm. In one embodiment, the curable layer has a layer thickness that is substantially the same throughout the curable layer. See, for example, curable layer 16 of FIG. 1. In other embodiments, the curable layer has a layer thickness that varies from a first location within the curable layer to one or more other locations within the curable layer. In either case, one or more additional optional layers may be applied over the curable layer so as to conform to the thickness variations in the curable layer.

In some embodiments, a portion of or all of an upper surface of the curable layer (e.g., upper surface 17 of curable layer 16 shown in FIG. 1) is exposed to a given environment such that there are no additional layers above at least a portion of (or all of) the upper surface of the curable layer. In other embodiments (described below), a portion of (or all of) an upper surface of the curable layer (e.g., upper surface 17 of curable layer 16 shown in FIG. 1) is covered with one or more additional layers. In one exemplary embodiment, a portion of (or all of) an upper surface of the curable layer (e.g., upper surface 17 of curable layer 16 shown in FIG. 1) is covered with one or more additional layers, wherein the one or more additional layers comprise one or more polymeric materials.

D. Optional Additional Layers

The multi-layered colorimetric sensors of the present invention may further comprise additional layers between or on any of the previously described layers, as long as the additional layer (or layers) does not negatively impact the ability of the sensor to provide a response signal to a user or device. Additional layers could include tie layers, structural layers, adhesive layers, hard coat layers, other protective layers, masking layers, etc.

In one exemplary embodiment, the multi-layered colorimetric sensor includes one or more additional layers above the curable layer. Suitable additional layers that may at least partially cover the curable layer include, but are not limited to, an optically clear protective layer, a masking layer, a transparent layer or laminate, or a combination thereof. For example, a masking layer may be used to temporarily or permanently shield a portion of the curable layer from exposure to radiation or thermal energy. The additional layers may be applied directly onto the curable layer or may be temporarily or permanently bonded to the curable layer via a tie layer or other adhesive layer. In one exemplary embodiment, a masking layer is provided over a portion of the curable layer in the form of a pattern. In this embodiment, upon exposure to radiation or thermal energy, the colorimetric sensor displays a signal in the form of a signal pattern (i.e., a reverse pattern of the masking layer on the curable layer). The signal pattern may have any desired configuration including, but not limited to, shapes, letters, words, a specific message to the user, safety instructions to the user, a company logo, etc.

In another exemplary embodiment, an optically clear protective layer is provided over at least a portion of the curable layer or the entire upper surface of the curable layer. The optically clear protective layer may comprise, for example, a polyurethane hard coat composition.

In yet another exemplary embodiment, the multi-layered colorimetric sensor includes one or more additional layers below the support substrate (e.g., adjacent to outer surface 18 shown in FIG. 1). Suitable additional layers that may at least partially cover (or completely cover) the support substrate include, but are not limited to, an adhesive layer (e.g., a pressure sensitive adhesive (PSA) layer, a heat-activatable adhesive layer such as a hot melt adhesive, or any combination thereof), a temporary substrate (e.g., a release liner covering a PSA layer), a permanent article (e.g., an article which is to be exposed to a desired amount of radiation or thermal energy), or any combination thereof. In one desired embodiment, the multi-layered colorimetric sensor comprises a PSA layer adjacent to the support substrate so that the sensor can be attached to an article which is to be exposed to a desired amount of radiation or thermal energy. In this embodiment, any known PSA may be used. Suitable PSAs include, but are not limited to, PSAs disclosed in U.S. Pat. No. RE 24,906 (Ulrich); U.S. Pat. No. 5,512,650 (Leir et al.); and U.S. Pat. No. 5,393,787 (Nestegard et al.), the subject matter of which is hereby incorporated by reference in its entirety.

II. Methods of Making Multi-layered Colorimetric Sensors

The present invention is also directed to methods of making multi-layered colorimetric sensors. The multi-layered colorimetric sensors of the present invention can be created via conventional coating methods. For example, curable layers may be made by spin-coating, dip-coating, solution coating, extrusion coating, or other suitable techniques known in the art. The curable layer may also be made by plasma deposition processes such as plasma polymerization. The reflective surface may be made by standard vapor coating techniques such as evaporation, sputtering, chemical vapor deposition (CVD), plasma deposition, or flame deposition. Another method for making the reflective surface is plating out of solution.

In some embodiments, the method of making a multi-layered colorimetric sensor comprises tailoring the sensor to exhibit a change in one or more optical properties (e.g., a change in color, a change in optical thickness, or a change in reflectance spectrum (e.g., a change in the intensity of a reflectance value at a given wavelength or a change in a reflectance peak value from one wavelength to another wavelength)) upon exposure to a predetermined amount of radiation or thermal energy. In one exemplary method of tailoring a colorimetric sensor to exhibit a change in one or more optical properties upon exposure to a predetermined amount of radiation or thermal energy, the method comprises the steps of (1) choosing a specific amount of radiation or thermal energy; (2) formulating a curable composition that exhibits a change in one or more optical properties when (i) applied over a reflective surface at a curable layer thickness, and (ii) subsequently exposed to the specific amount of radiation or thermal energy; (3) providing a support substrate having a reflective surface thereon; and (4) applying the curable composition over the reflective surface so as to form a curable layer having the curable layer thickness. In this exemplary method, the curable composition may comprise (a) one or more of the above-described polymerizable monomers alone or in combination with at least one of the above-described non-functionalized polymers, (b) one or more of the above-described functionalized polymers having at least one polymerizable functional group thereon alone or in combination with at least one of the above-described non-functionalized polymers, or (c) any combination thereof. Once the tailored sensor has been made, the sensor may be utilized in a method comprising the steps of positioning the sensor in proximity to (or on) an article that is to be exposed to radiation or thermal energy; and exposing the sensor and article to an amount of radiation or thermal energy. In some embodiments, the article (or a portion of the article) may be used as the support substrate, the reflective surface, or both, such that by applying a curable layer onto the article, the coated article is capable of providing a response signal when exposed to radiation or thermal energy.

III. Methods of Using Multi-layered Colorimetric Sensors

The multi-layered colorimetric sensors of the present invention may be used alone or may be part of a device for detecting exposure to radiation or thermal energy. In one embodiment of the present invention, the multi-layered sensor is at least partially enclosed by a housing. The housing desirably comprises at least one opening positioned above the curable layer so that the curable layer is viewable through the at least one opening. In some embodiments, the housing comprises at least one opening, wherein the at least one opening provides a restricted view of an upper surface of the curable layer so as to minimize any potential change in the viewable color of the sensor (and confusion of the user as to the sensor reading) due to the angle of view. Typically, the restricted view allows a view of the upper surface of the curable layer within an angle of ±30°, more desirably, ±15° from a normal view (i.e., a view from a position perpendicular to the outer surface of the curable layer).

The housing may also be used to constrain the multi-layered colorimetric sensor of the present invention so that the sensor is in an arched or cylindrical shape. Such a configuration allows a user to view the sensor from a larger range of viewing angles with minimal shift in color.

The multi-layered colorimetric sensors may be used in a system comprising the sensor, a radiation or thermal energy source, and, optionally, a device capable of monitoring a change in one or more optical properties (e.g., a change in color, a change in optical thickness, or a change in reflectance spectrum) of the sensor. The radiation or thermal energy source can be any conventional radiation or thermal energy source including, but not limited to, high and low intensity UV lamps, e-beam devices (e.g., electrocurtain processors), ovens, microwave ovens, the sun, ambient heat or light, gamma sources, visible light sources, etc. The monitoring can be done in a variety of ways. It could be done visually, with the human eye or with a photo-detector, or by other suitable means.

Two or more multi-layered colorimetric sensors may be used together to form an array. The array may be in any suitable configuration. For example, an array may comprise two or more sensors side by side, or sensors may be attached to, or constructed on, opposite sides of a substrate. The sensors within a given array may be of the same type or may be different. Arrays of multi-layered colorimetric sensors would be useful for indicating (i) exposure to radiation or thermal energy, (ii) exposure to a specific amount of radiation or thermal energy, (iii) exposure to a specific wavelength of radiation or a specific temperature, or (iv) any combination of (i) to (iii), based upon their unique response signatures from the array in aggregate.

Exemplary arrays of multi-layered colorimetric sensors are shown in FIGS. 4A-4F. Each of exemplary arrays 40-45 comprises a base layer 47 and film stacks 48 on an upper surface of base layer 47. Base layer 47 may be a support substrate or a reflective surface on a support substrate as described above. Alternatively, base layer 47 may be an article to be exposed to radiation or thermal energy onto which is attached two or more film stacks 48. Film stacks 48 within a given array may have identical or different chemical compositions and may comprise one or more layers (e.g., a curable layer alone or in combination with a support substrate or a reflective surface on a support substrate as described above). For example, two or more film stacks 48 within a given array may have (i) different curable layer chemistries, (ii) different curable layer thicknesses, or (iii) both (i) and (ii).

In one exemplary embodiment of the present invention, the array comprises two or more colorimetric sensors, wherein each colorimetric sensor in the array (i) shares a common reflective layer and (ii) comprises a stack of layers including (1) a curable layer and (2) one or more optional layers selected from an optically clear protective layer, a masking layer, and combinations thereof.

As shown in FIGS. 4A-4F, multi-layered colorimetric sensors may be configured as one or more discrete sensor elements in a uniformly distributed manner (e.g., array 41), in a non-uniform manner (e.g., array 45), side by side (bar gauge type, etc.) (e.g., array 42), or any other configuration.

The multi-layered colorimetric sensors may be used in a variety of applications. In one exemplary embodiment, the multi-layered colorimetric sensors are used in a method of detecting exposure of an article to a threshold amount of radiation or thermal energy. In this embodiment, the method of detecting exposure of an article to a threshold amount of radiation or thermal energy may comprise the steps of (1) providing an article; (2) providing a colorimetric sensor comprising (i) a support substrate; (ii) a reflective surface on the support substrate; and (iii) a curable layer over the reflective surface, the curable layer comprising (a) one or more polymerizable monomers alone or in combination with at least one non-functionalized polymer, (b) a functionalized polymer having at least one polymerizable functional group thereon alone or in combination with at least one non-functionalized polymer, or (c) any combination thereof, (3) exposing the article and the sensor to a radiation or thermal energy source, and (4) monitoring the sensor for a change in one or more optical properties (e.g., a change in color, a change in optical thickness, or a change in reflectance spectrum) resulting from exposure to the threshold amount of radiation or thermal energy. Such a method can be used, for example, when the article comprises a curable article, an article moving through a processing line, an article subjected to a sterilization process, an article forming a part of or used in combination with a germicidal lamp, an article forming a part of or used in combination with clothing or other wearable items, a portion of a human body, etc.

The above-described method of detecting exposure of an article to a threshold amount of radiation or thermal energy may comprise a continuous process in which the article and one or more sensors travel along a path through one or more process stations. In the above-described method, the exposing step may comprise two or more separate process steps in which the article and one or more sensors are exposed to a radiation or thermal energy source. The monitoring step may comprise visually inspecting the one or more sensors or may comprise utilizing a spectrometer (or other suitable device) to measure one or more optical properties of the one or more sensors.

The multi-layered colorimetric sensors may also be used in a method of measuring an amount of exposure of an article to radiation or thermal energy. In one exemplary method, the method of measuring an amount of exposure of an article to radiation or thermal energy comprises the steps of (1) providing an article; (2) providing a colorimetric sensor having a first set of optical properties and comprising (i) a support substrate; (ii) a reflective surface on the support substrate; and (iii) a curable layer over the reflective surface, the curable layer comprising (a) one or more polymerizable monomers alone or in combination with at least one non-functionalized polymer, (b) a functionalized polymer having at least one polymerizable functional group thereon alone or in combination with at least one non-functionalized polymer, or (c) any combination thereof, (3) exposing the article and the sensor to a radiation or thermal energy source so as to produce a colorimetric sensor having a second set of optical properties; and (4) comparing the second set of optical properties to the first set of optical properties. In this exemplary method, the exposing step may comprise two or more separate process steps in which the article and sensor are exposed to a radiation or thermal energy source, and the sensor provides an indication of a cumulative amount of radiation or thermal energy from the two or more separate process steps. Further, the comparing step may comprise measuring a change in a spectral blueshift of the sensor.

The multi-layered colorimetric sensors of the present invention provide a number of advantages over known sensors. One particularly important advantage over known sensors is the ability of the multi-layered colorimetric sensors of the present invention to signal exposure to a dose of radiation or thermal energy using a relatively thin layer of curable material. As described above, the multi-layered colorimetric sensors of the present invention are capable of providing a signal indicating exposure to a dose of radiation or thermal energy while comprising a curable layer having a thickness of as little as 50 nm.

Another advantage of the multi-layered colorimetric sensors of the present invention is that the sensors can be constructed so that ambient moisture or water does not create a change in the optical properties of the sensor. The resulting multi-layered colorimetric sensor can be used in applications requiring relatively high humidity and/or exposure to water.

In some applications relating to article cure monitoring, the composition of the article being cured can be used as the curable layer of the multi-layered colorimetric sensor of the present invention, thus avoiding having to calibrate the response of the sensor to the cure of the article. These applications provide a clear advantage over sensors using photochromic or thermochromic dyes, which require a correlation step to relate a change in a photochromic or thermochromic dye to exposure to an amount of thermal or light energy.

Further, as described above, the multi-layered colorimetric sensors can be readily processed using conventional coating techniques. For example, the reflective layer(s) can be deposited via evaporative or sputter coating, while the curing layer(s) can be deposited via solvent coating.

EXAMPLES

The present invention may be illustrated by way of the following examples. Unless otherwise stated, the multi-layered colorimetric sensor samples were viewed from an angle normal to the surface of the sensor. Other viewing angles may be used. The color observed can vary depending on the angle of observation.

The following examples are merely for illustrative purposes and are not meant to be limiting on the scope of the appended claims. All parts, percentages, ratios, etc. in the examples and the rest of the specification are by weight, unless noted otherwise. Solvents and other reagents used were obtained from Sigma-Aldrich Chemical Company (Milwaukee, Wis.) unless otherwise noted.

The following materials were used in the examples:

| Abbreviation or Trade Designation | Description |
| --- | --- |
| VAZO-67 | 2,2-azobis(2-methylbutyronitrile) commercially available from E. I. duPont de Nemours & Co. (Wilmington, DE) |
| TMPTA | trimethylolpropane triacrylate, commercially available from Sartomer (Exton, PA) |
| DTMPTA | Ditrimethylolpropane tetraacrylate, commercially available from Sartomer (Exton, PA) |
| THF | tetrahydrofuran |
| DPIH | diphenyl iodonium hexafluorophosphate |
| DMAB | (4-dimethylamino)benzophenone |
| VAZO-52 | 2,2'-azobis(2,4-dimethylvaleronitrile) commercially available from E. I. duPont de Nemours & Co. (Wilmington, DE) |
| PCHA | a homopolymer of cyclohexyl acrylate prepared in Preparative Example P1 below |
| IBA | isobornyl acrylate |
| HEMA | 2-hydroxyethyl methacrylate |
| IOA | isooctyl acrylate |
| VDM | vinyl dimethyl azlactone, (2-ethenyl-4,4-dimethyl-1,3-oxazolin-5-one), commercially available from SNPE, Inc. (Princeton, NJ) |
| DBU | 1,8-diazabicyclo[5.4.0]-undec-7-ene |
| IRGACURE 819 | bis(2,4,6-trimethylbenzoyl)phenylphosphineoxide commercially available from Ciba Specialty Chemicals (Hawthorne, NJ) |
| PET | polyethylene terephthalate film having a film thickness of 52 micrometers |

Gel Permeation Chromatography (GPC):

Molecular weight of the materials was measured using Gel Permeation Chromatography (GPC). Samples were prepared by the addition of 10 mL of THF to approximately 25 mg of sample. The solution was filtered using a 0.2 micrometer polytetrafluoroethylene (PTFE) syringe filter. 150 microliters of solution was injected into a six column set (Jordi Associates mixed bed and 500A columns, Jordi Associates Inc., Bellingham, Mass.) in combination with a Waters 2695™ Separation Module (Waters Corp., Milford, Mass.). The Waters 2695™ operated at 35° C., using THF as the eluent, flowing at a rate of 1.0 mL/min. Changes in concentration were detected by a Viscotek Model 100 dual refractive index detector (Viscotek Europe Ltd, Crowthorne, Berkshire, UK). The molecular weight calculations were based upon a calibration made of narrow dispersity polystyrenes ranging in molecular weight from 7.5E6 to 580 AMU. The actual calculations were completed with a Cirrus GPC software (Polymer Laboratories, Inc., Amherst, Mass.). The results are expressed as $M_w$ (weight average molecular weight), $M_n$ (number average molecular weight), and the polydispersity index (the ratio of $M_w:M_n$).

Preparative Example P1

A homopolymer of cyclohexyl acrylate (PCHA) was prepared. In a jar, 49.33 grams of cyclohexyl acrylate, 0.55 gram of isooctyl 3-mercaptopropionate, and 0.21 gram of VAZO-67 were dissolved in 125 milliliters of toluene. The jar was sealed, placed in a water shaker bath and heated at 80° C. for 16 hours. The reaction mixture was evaporated to half of its original volume under reduced pressure. The resulting solution was poured into methanol and a precipitate formed. The solvent was decanted off and the precipitate was redissolved in toluene. This precipitation procedure was performed a total of three times. After the third precipitation, the solid was dried under high vacuum in a vacuum oven at 60° C. for 20 hours to yield a clear solid (38.37 grams). GPC analysis of the purified polymer showed it to have $M_w=34,200$, $M_n=13,300$, and a polydispersity of 2.58.

Preparative Examples P2-P3

Curable compositions were prepared by mixing a solution of the PCHA from Preparative Example P1 (40% solids in toluene) with other components as shown in Table 1.

TABLE 1

Composition Components of Preparative Examples P2-P3

| Preparative Example | PCHA solution (grams) | TMPTA (grams) | DPIH (grams) | DMAB (grams) | THF (grams) |
| --- | --- | --- | --- | --- | --- |
| P2 | 0.875 | 0.15 | 0.009 | 0.0045 | 3.96 |
| P3 | 0.35 | 0.06 | 0.0018 | 0.0009 | 1.59 |

Preparative Examples P4-P7

Curable compositions were prepared by mixing a solution of the PCHA from Preparative Example P1 (40% solids in toluene) with other components as shown in Table 2.

TABLE 2

Composition Components of Preparative Examples P4-P7

| Preparative Example | PCHA solution (grams) | TMPTA (grams) | DTMPTA (grams) | VAZO-52 (grams) | Toluene (grams) | THF (grams) |
| --- | --- | --- | --- | --- | --- | --- |
| P4 | 0.875 | 0.15 | — | 0.005 | 3.97 | — |
| P5 | 0.35 | 0.06 | — | 0.002 | 1.588 | — |
| P6 | 1.75 | — | 0.31 | 0.004 | — | 7.94 |
| P7 | 0.525 | 0.090 | — | — | 2.385 | — |

Preparative Example P8

In a glass polymerization bottle was placed 1.5 grams IBA, 6.5 grams IOA, 2.0 grams VDM, 10 grams ethyl acetate, 0.15 gram carbon tetrabromide, and 0.05 gram benzoyl peroxide. The bottle was purged with nitrogen, sealed and shaken in a water bath maintained at 60° C. for 17 hours. The ethyl acetate was removed under reduced pressure to produce a copolymer with $M_w$=42,200, $M_n$=16,500, and a polydispersity of 2.56 as measured by GPC.

Preparative Example P9

In a vial, the copolymer of Preparative Example P8 was dissolved in 14 milliliters of toluene. To this solution was added 1.87 grams HEMA and 216 microliters of DBU. The vial was sealed and placed in an oil bath maintained at 65° C. and stirred for 17 hours. GPC analysis showed the resulting functional polymer to have $M_w$=61,800, $M_n$=19,700, and a polydispersity of 3.14.

Preparative Examples P10-P14

Curable compositions were prepared by mixing solutions of the functional polymer from Preparative Example P9 (45% solids in toluene) with other components as shown in Table 3 and then filtering the resulting solutions through a 0.2 micrometer filter.

TABLE 3

Composition Components of Preparative Examples P10-P14

| Preparative Example | P9 solution (grams) | DTMPTA (grams) | IRGACURE 819 (grams) | VAZO-52 (grams) | THF (grams) |
|---|---|---|---|---|---|
| P10 | 0.31 | — | 0.0028 | — | 1.69 |
| P11 | 0.31 | — | — | 0.0028 | 1.69 |
| P12 | 0.33 | 0.017 | 0.0033 | — | 2.67 |
| P13 | 0.31 | 0.019 | — | 0.0032 | 2.57 |
| P14 | 0.47 | — | — | — | 2.53 |

Preparative Example P15

In a glass polymerization bottle was placed 1.5 grams IBA, 7.5 grams IOA, 1.0 gram VDM, 10 grams ethyl acetate, 0.15 gram carbon tetrabromide, and 0.05 gram benzoyl peroxide. The bottle was purged with nitrogen, sealed and shaken in a water bath maintained at 60° C. for 17 hours. The ethyl acetate was removed under reduced pressure to produce a copolymer.

Preparative Example P16

In a vial, the copolymer of Preparative Example P15 was dissolved in 14 milliliters of toluene. To this solution was added 1.85 grams pentaerythritol triallyl ether and 108 microliters of DBU. The vial was sealed and placed in an oil bath maintained at 65° C. and stirred for 17 hours. The resulting functional polymer was purified by pouring the reaction mixture into 500 milliliters of methanol. The methanol was decanted off and the functional polymer was dried under vacuum (0.3 mm Hg) at room temperature for 20 hours. GPC analysis showed the resulting functional polymer to have $M_w$=91,100, $M_n$=13,400, and a polydispersity of 6.82.

Preparative Example P17

A curable composition was made by dissolving the functional polymer from Preparative Example P16 in toluene and adding 0.002 gram of dicumyl peroxide so that the resulting solution was 10% by weight solids.

Preparative Example 18

A curable composition was made by dissolving the functional polymer from Preparative Example P16 in toluene so that the resulting solution was 10% by weight solids.

Example 1

Eleven identical ML sensor samples (Samples 1A-1K) were prepared by taping 3.2 cm by 3.8 cm (1.25 in by 1.5 in) pieces of aluminized PET onto individual glass slides. Each piece of aluminized PET was formed by depositing an aluminum reflective layer (100 nm) onto a polyester substrate layer (50 µm) in a single pass (15.24 m/min) through a vacuum web system, and then cutting the polyester substrate to a desired size. The aluminum reflective layer was thermally evaporated by feeding 0.1587 cm diameter aluminum wire (Alcoa stock number 1199, Pittsburgh, Pa.) onto an electrically heated (7V, 1250 amp) evaporation bar at a feed rate of 225 mm/min.

An approximately 600 nanometer thick layer of the curable composition from Preparative Example P2 was spin coated onto each piece of aluminized PET (spun for 30 seconds at 2400 rpm). A reflectance spectrum was obtained for each sample. Each sample was then placed under a bank of low intensity UV/Vis lamps (light intensity=3.60 mW/cm$^2$) and irradiated for varying amounts of time. A reflectance spectrum was obtained for each sample after curing and compared with that of the corresponding sample pre-curing, the difference being recorded as the Spectral Shift. Table 4 summarizes the samples, the curing time for each and the Spectral Shift (blueshift) observed for each.

TABLE 4

Exposure Time and Spectral Shift (blueshift) Data

| Sample | Exposure Time (hours) | Spectral Shift (nm) |
|---|---|---|
| 1A | 0.25 | 5 |
| 1B | 0.5 | 30 |
| 1C | 1 | 8 |
| 1D | 2 | 16 |
| 1E | 3 | 21 |
| 1F | 4.5 | 22 |
| 1G | 6 | 52 |
| 1H | 10 | 56 |
| 1I | 21 | 85 |
| 1J | 26 | 88 |
| 1K | 45 | 88 |

Figure 5A:
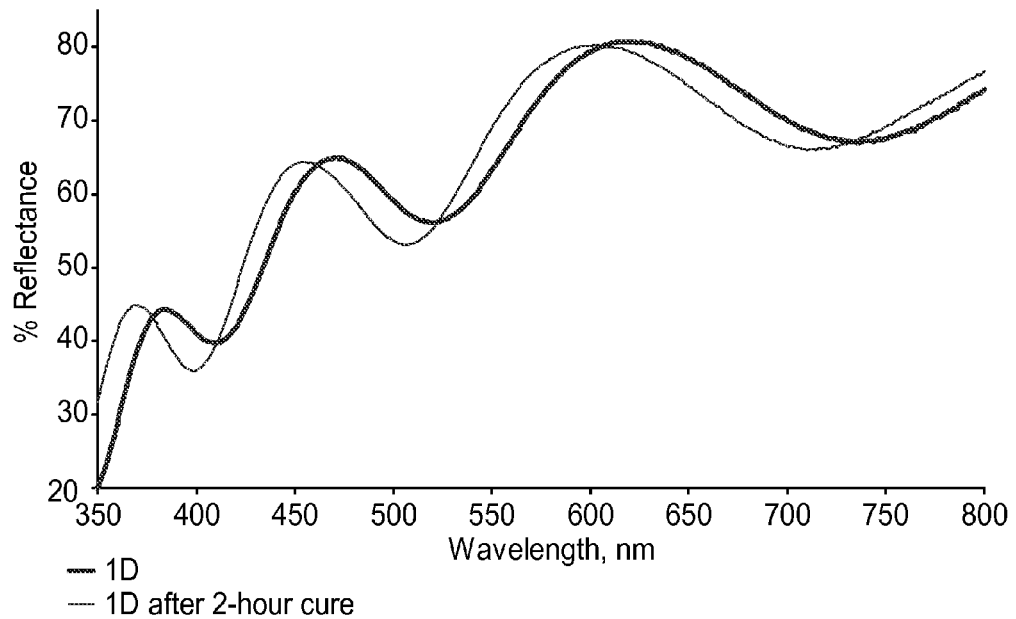
FIGS. 5A-5B graphically depict pre-and post-cure reflectance spectra of exemplary multi-layered colorimetric sensor samples of Example 1 of the present invention.
Figure 5B:
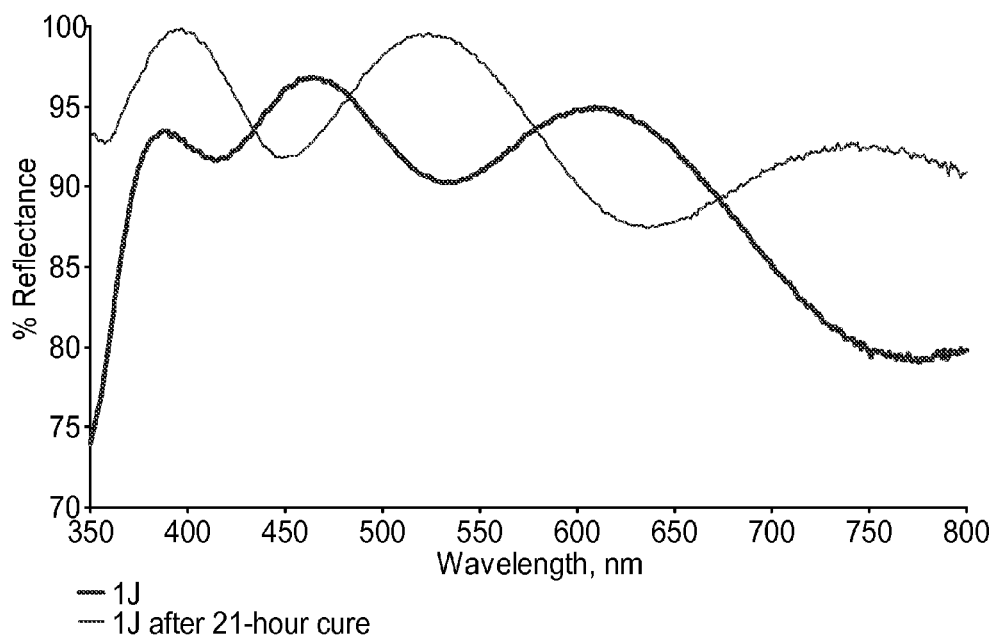
Figure 6:
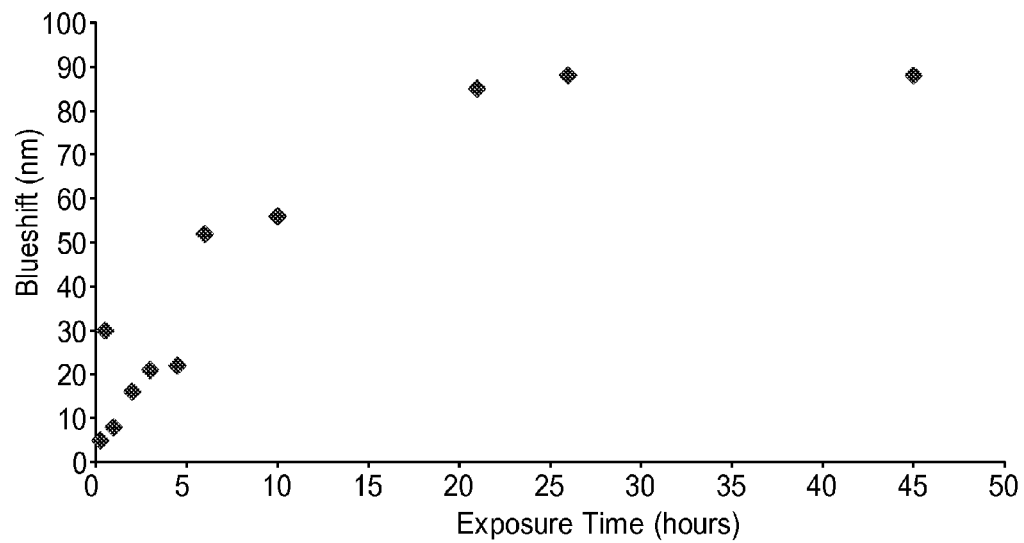
FIG. 6 graphically depicts a plot of spectral shift vs. exposure time for exemplary multi-layered colorimetric sensor samples of Example 1 of the present invention.

FIGS. 5A-5B show representative examples of the pre-and post-cure reflectance spectra for two of the samples (e.g., 1D and 1 J). FIG. 6 is a plot of spectral shift vs. exposure time.

Figure 7:
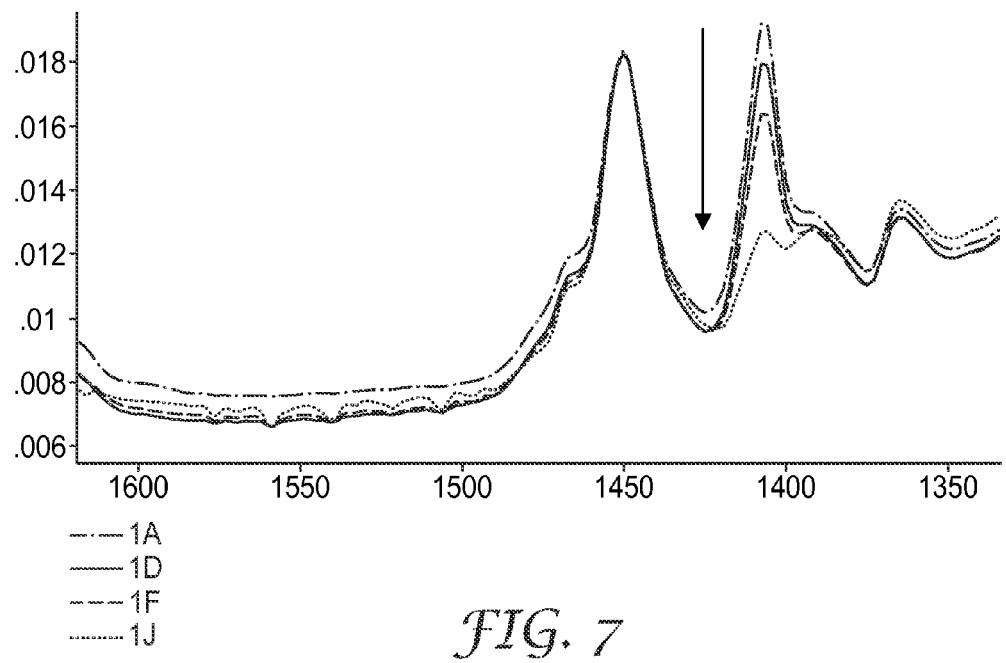
FIG. 7 graphically depicts ATR-IR spectra overlays of exemplary multi-layered colorimetric sensor samples of Example 1 of the present invention.

Attenuated total reflectance infrared (ATR-IR) spectra were acquired of each sample post-curing. FIG. 7 shows overlay plots of a region (1350-1600 cm$^{-1}$) of the ATR-IR spectrum of samples 1A, 1D, 1F, and 1J that are further described in Table 1. The absorbance peak at 1450 cm$^{-1}$ was unchanged in the samples and was used as a reference peak. The absorbance peak at 1410 cm$^{-1}$ coming from TMPTA (=CH δ in-plane bend) made it convenient to monitor the depletion of TMPTA. As can be seen from the overlays, the amount of TMPTA continually decreased with increasing exposure time consistent with the reflectance spectra observations.

Example 2

A ML sample identical to those described in Example 1 was prepared. A reflectance spectrum was obtained of the sample. The sample was then placed under a bank of low intensity UV/Vis lamps (light intensity=3.60 mW/cm$^2$) and irradiated for 15 minutes. A second reflectance spectrum was obtained of the sample. The sample was irradiated for another 15 minutes (30 minutes total), and a third reflectance spectrum was obtained of the sample. This procedure of irradiating and acquiring spectra was repeated to obtain a profile of spectral shift versus exposure time. Table 5 summarizes the Spectral Shift (blueshift) observed after each exposure time point for this sample.

TABLE 5

Exposure Time and Spectral Shift (blueshift) Data

| Exposure Time (hours) | Spectral Shift (nm) |
|---|---|
| 0.25 | 3 |
| 0.5 | 4 |
| 1 | 9 |
| 2 | 13 |
| 3 | 28 |
| 21 | 90 |

Example 3

Two identical ML sensor samples (3A and 3B) were prepared by spin-coating an approximately 500 nanometer thick layer of the curable composition of Preparative Example P3 (spun for 30 seconds at 1600 rpm) onto silicon wafers of 3.8 cm by 3.8 cm (1.5 in by 1.5 in). A reflectance spectrum was obtained for Sample 3B. Sample 3B was then placed under a bank of low intensity UV/Vis lamps (light intensity=3.60 mW/cm$^2$) and irradiated for 20 hours. A reflectance spectrum was obtained of Sample 3B post-curing. Sample 3B showed a Spectral Shift (blueshift) of 93 nm after being cured for 20 hours. Visual observation of Sample 3B was made during the course of the 20 hours of curing, comparing the color change of Sample 3B to Sample 3A. A distinct color change from a blue-green color to a red-blue color occurred in cured Sample 3B.

Example 4

A series of identical ML sensor samples (Samples 4A-4D) were prepared by taping 3.2 cm by 3.8 cm (1.25 in by 1.5 in) pieces of aluminized PET onto individual glass slides. An approximately 500 nanometer thick layer of the curable composition from Preparative Example P4 was spin-coated onto each piece of aluminized PET (spun for 30 seconds at 1600 rpm). These samples were divided into 4 sets, which were used to do a series of spectral shift vs. exposure time experiments at a given temperature. For each set, a series of identical samples were heated for different lengths of time at a specific temperature using a conventional drying oven. The sets were 4A (100° C.), 4B (70° C.), 4C (55° C.), and 4D (45° C.). A reflectance spectrum was obtained of each sample post-curing and compared with that of pre-curing to calculate the Spectral Shift. The data are summarized in Table 6.

TABLE 6

Exposure Time and Spectral Shift (blueshift) Data

| Sample | Temperature (° C.) | Exposure Time at Temperature (hours) | Spectral Shift (nm) |
|---|---|---|---|
| 4A | 100 | 0.25 | 80 |
| 4A | 100 | 0.5 | 97 |
| 4A | 100 | 1.0 | 105 |
| 4A | 100 | 2.0 | 107 |
| 4A | 100 | 3.0 | 111 |
| 4B | 70 | 0.25 | 35 |
| 4B | 70 | 0.5 | 52 |
| 4B | 70 | 1.0 | 82 |
| 4B | 70 | 2.0 | 92 |
| 4B | 70 | 3.0 | 95 |
| 4B | 70 | 4.0 | 91 |
| 4B | 70 | 6.0 | 93 |
| 4B | 70 | 21.0 | 92 |
| 4C | 55 | 0.25 | 12 |
| 4C | 55 | 0.5 | 30 |
| 4C | 55 | 1.0 | 42 |
| 4C | 55 | 2.0 | 70 |
| 4C | 55 | 3.0 | 71 |
| 4C | 55 | 4.0 | 92 |
| 4C | 55 | 5.5 | 85 |
| 4C | 55 | 22.5 | 99 |
| 4D | 45 | 0.25 | 6 |
| 4D | 45 | 0.5 | 9 |
| 4D | 45 | 1.0 | 18 |
| 4D | 45 | 2.0 | 34 |
| 4D | 45 | 4.0 | 47 |
| 4D | 45 | 8.0 | 58 |
| 4D | 45 | 22 | 65 |
| 4D | 45 | 27.5 | 92 |

Example 5

Two identical ML sensor samples (5A and 5B) were prepared by spin-coating an approximately 500 nanometer thick layer of the curable composition of Preparative Example P5 (spun for 30 seconds at 1600 rpm) onto silicon wafers of 3.8 centimeters by 3.8 centimeters (1.5 inches by 1.5 inches). A reflectance spectrum was obtained for Sample 5B. Sample 5B was then placed in a conventional drying oven and heated at 55° C. for 6 hours. A reflectance spectrum was obtained of Example 5B post-curing. Example 5B showed a Spectral Shift (blueshift) of 90 nm after being cured for 6 hours. Visual observation of Sample 5B was made during the course of 6 hours of curing, comparing the color change of Sample 5B to Sample 5A. A distinct color change from a blue-green color to a red-blue color occurred in cured Sample 5B.

Example 6

A ML sensor sample was prepared by spin-coating an approximately 500 nanometer thick layer of the curable composition of Preparative Example P6 (spun for 30 seconds at 1500 rpm) onto silicon wafers of 2.5 cm by 2.5 cm (1.0 in by 1.0 in). A reflectance spectrum was obtained of the sample. The sample was then placed in a conventional drying oven and heated at 70° C. for 15 minutes. A second reflectance spectrum was obtained of the sample. The sample was heated at 70° C. for another 15 minutes (30 minutes total), and a third reflectance spectrum was obtained of the sample. This procedure of heating and acquiring spectra was repeated to obtain a profile of spectral shift versus exposure time at 70° C. Table 7 summarizes the Spectral Shifts (blueshifts) observed after each exposure time point for this sample.

TABLE 7

Exposure Time and Spectral Shift (blueshift) Data

| Exposure Time (hours) | Spectral Shift (nm) |
|---|---|
| 0.25 | 9 |
| 0.5 | 20 |
| 1 | 22 |
| 2 | 27 |
| 3 | 23 |
| 20 | 42 |

Example 7

Four identical ML sensor samples (7A-7D) were prepared by taping 3.2 cm by 3.8 cm (1.25 in by 1.5 in) pieces of aluminized PET onto individual glass slides. An approximately 500 nanometer thick layer of the curable composition of Preparative Example P7 was spin coated onto each piece of aluminized PET (spun for 30 seconds at 1600 rpm). A reflectance spectrum was obtained of each sample. The samples were fastened to a web and irradiated at different dosages using an Electrocurtain low voltage beam device, Model CB300 from Energy Sciences, Inc. (Wilmington, Del.). A reflectance spectrum was obtained of each sample post-curing and compared with that of pre-curing and recorded as Spectral Shift (blueshift). Table 8 summarizes the samples, the voltage, e-beam current, web speed, dosage and the Spectral Shift (blueshift) observed for each sample. The dosage had units of kilograys (kGy) where 1 Mrad is equal to 10 kGy.

TABLE 8

Exposure and Spectral Shift (blueshift) Data

| Sample | Voltage (keV) | E-Beam Current (mA) | Web Speed (m/min.) | Dosage (kGy) | Spectral Shift (nm) |
|---|---|---|---|---|---|
| 7A | 200 | 0.9 | 18 | 5 | 12 |
| 7B | 200 | 1.45 | 12 | 10 | 15 |
| 7C | 200 | 2.1 | 6 | 30 | 18 |
| 7D | 200 | 4.2 | 6 | 60 | 20 |

Example 8

A ML sample was prepared by spin-coating an approximately 500 nanometer thick layer of the curable composition of Preparative Example P10 (spun for 30 seconds at 1800 rpm) onto silicon wafers of 2.5 cm by 3.8 cm (1.0 in by 1.5 in). A reflectance spectrum was obtained of the sample. The sample was then placed under a bank of low intensity UV/Vis lamps (light intensity=3.60 mW/cm$^2$) and irradiated for 15 minutes. A second reflectance spectrum was obtained of the sample. The sample was irradiated for another 15 minutes (30 minutes total), and a third reflectance spectrum was obtained of the sample. This procedure of irradiating and acquiring spectra was repeated to obtain a profile of spectral shift versus exposure time. Table 9 summarizes the Spectral Shifts (blueshifts) observed after each exposure time point for this sample.

TABLE 9

Exposure Time and Spectral Shift (blueshift) Data

| Exposure Time (hours) | Spectral Shift (nm) |
|---|---|
| 0.25 | 15 |
| 0.5 | 20 |
| 1 | 20 |
| 2 | 25 |
| 3 | 26 |
| 4 | 25 |
| 22 | 41 |

Example 9

A ML sample was prepared by spin coating an approximately 500 nm thick layer of the curable composition of Preparative Example P11 (spun for 30 sec at 1800 rpm) onto silicon wafers of 2.5 cm by 3.8 cm (1.0 in by 1.5 in). A reflectance spectrum was obtained of the sample. The sample was then placed in a conventional drying oven and heated at 70° C. for 15 minutes. A second reflectance spectrum was obtained of the sample. The sample was heated at 70° C. for another 15 minutes (30 minutes total), and a third reflectance spectrum was obtained of the sample. This procedure of heating and acquiring spectra was repeated to obtain a profile of spectral shift versus exposure time at 70° C. Table 10 summarizes the Spectral Shifts (blueshifts) observed after each exposure time point for this sample.

TABLE 10

Exposure Time and Spectral Shift (blueshift) Data

| Exposure Time (hours) | Spectral Shift (nm) |
|---|---|
| 0.25 | 42 |
| 0.5 | 39 |
| 1 | 41 |
| 2 | 45 |
| 3 | 46 |
| 4 | 46 |
| 22 | 50 |

Example 10

A ML sample was prepared by spin-coating an approximately 500 nanometer thick layer of the curable composition of Preparative Example P12 (spun for 30 seconds at 1500 rpm) onto silicon wafers of 2.5 cm by 2.5 cm (1.0 in by 1.0 in). A reflectance spectrum was obtained of the sample. The sample was then placed under a bank of low intensity UV/Vis lamps (light intensity=3.60 mW/cm$^2$) and irradiated for 15 minutes. A second reflectance spectrum was obtained of the sample. The sample was irradiated for another 15 minutes (30 minutes total), and a third reflectance spectrum was obtained of the sample. This procedure of irradiating and acquiring spectra was repeated to obtain a profile of spectral shift versus exposure time. Table 11 summarizes the Spectral Shifts (blueshifts) observed after each exposure time point for this sample.

TABLE 11

Exposure Time and Spectral Shift (blueshift) Data

| Exposure Time (hours) | Spectral Shift (nm) |
|---|---|
| 0.25 | 8 |
| 0.5 | 8 |
| 1 | 13 |
| 2 | 5 |
| 3 | 16 |
| 19.5 | 23 |

Example 11

A ML sample was prepared by spin coating an approximately 500 nm thick layer of the curable composition of Preparative Example P13 (spun for 30 sec at 1500 rpm) onto silicon wafers of 2.5 cm by 2.5 cm (1.0 in by 1.0 in). A reflectance spectrum was obtained of the sample. The sample was then placed in a conventional drying oven and heated at 70° C. for 15 minutes. A second reflectance spectrum was obtained of the sample. The sample was heated at 70° C. for another 15 minutes (30 minutes total), and a third reflectance spectrum was obtained of the sample. This procedure of heating and acquiring spectra was repeated to obtain a profile of spectral shift versus exposure time at 70° C. Table 12 summarizes the Spectral Shifts (blueshifts) observed after each exposure time point for this sample.

TABLE 12

Exposure Time and Spectral Shift (blueshift) Data

| Exposure Time (hours) | Spectral Shift (nm) |
|---|---|
| 0.25 | 21 |
| 0.5 | 22 |
| 1 | 22 |
| 2 | 22 |
| 3 | 25 |
| 20 | 40 |

Example 12

Four identical ML sensor samples (12A-12D) were prepared by taping 3.2 cm by 3.8 cm (1.25 in by 1.5 in) pieces of aluminized PET onto individual glass slides. An approximately 500 nanometer thick layer of the curable composition from Preparative Example P14 was spin coated onto each piece of aluminized PET (spun for 30 seconds at 1800 rpm). A reflectance spectrum was obtained of each sample. The samples were fastened to a web and irradiated at different dosages of e-beam. A reflectance spectrum was obtained of each sample post-curing and compared with that of pre-curing to determine Spectral Shifts (blueshifts). Table 13 summarizes the samples, the voltage, e-beam current, web speed, dosage and the Spectral Shift (blueshift) observed for each sample.

TABLE 13

Exposure and Spectral Shift (blueshift) Data

| Sample | Voltage (keV) | E-Beam Current (mA) | Web Speed (m/min.) | Dosage (kGy) | Spectral Shift (nm) |
|---|---|---|---|---|---|
| 12A | 200 | 0.9 | 18 | 5 | 11 |
| 12B | 200 | 1.45 | 12 | 10 | 11 |
| 12C | 200 | 2.1 | 6 | 30 | 16 |
| 12D | 200 | 4.2 | 6 | 60 | 17 |

Example 13 and Comparative Example C1

For Example 13, ML sample was prepared by spin coating an approximately 600 nanometer thick layer of a curable composition using the solution of Preparative Example P17 (spun for 30 sec at 2200 rpm) onto a silicon wafer of 2.5 cm by 3.8 cm (1.0 in by 1.5 in). A reflectance spectrum was obtained of the sample. For Comparative Example C1, a ML sample was prepared by spin coating an approximately 600 nanometer thick layer of a curable composition using the solution of Preparative Example P18 (spun for 30 sec at 2200 rpm) onto a silicon wafer of 2.5 cm by 3.8 cm (1.0 in by 1.5 in). A reflectance spectrum was obtained of the sample. The samples were then placed in a conventional drying oven and heated at 100° C. for 15 minutes. A second reflectance spectrum was obtained of each sample. The samples were heated at 100° C. for another 15 minutes (30 minutes total), and a third reflectance spectrum was obtained of each sample. This procedure of heating and acquiring spectra was repeated to obtain a profile of spectral shift versus exposure time. Table 14 summarizes the Spectral Shifts (blueshifts) observed after each exposure time point at 100° C. for each of the two samples.

TABLE 14

Exposure Time and Spectral Shift (blueshift) Data

| Exposure Time (hours) | Spectral Shift for Example 13 (nm) | Spectral Shift for Comparative Example C1 (nm) |
|---|---|---|
| 0.25 | 14 | 3 |
| 0.5 | 15 | 3 |
| 1 | 15 | 5 |
| 2 | 17 | 5 |
| 3 | 18 | 5 |
| 20 | 27 | 15 |

Various modifications and alterations of this invention will become apparent to those skilled in the art without departing from the scope and spirit of this invention and it should be understood that this invention is not to be unduly limited to the illustrative embodiments set forth herein.

What is claimed is:

1. A colorimetric sensor for measuring exposure to radiation or thermal energy, said colorimetric sensor comprising:
a support substrate;
a reflective surface on said support substrate; and
a curable layer over said reflective surface, said curable layer comprising a functionalized polymer having pendant free-radically polymerizable groups, the functionalized polymer comprising the reaction product of (i) a polymer reactant having functional groups thereon, the functional group selected from a nucleophilic group or an electrophilic group and (ii) a bifunctional reactant comprising a reactive group capable of undergoing a nucleophilic/electrophilic reaction with the functional groups of the polymer reactant and at least one pendant free-radically polymerizable group;

wherein said sensor undergoes polymerization of said pendant free-radically polymerizable groups resulting in a change in one or more optical properties upon exposure to (i) a threshold amount of radiation or (ii) a threshold amount of thermal energy.

2. The colorimetric sensor of claim 1, wherein said support substrate comprises a polymer film or sheet, an all-polymeric mirror film, a glass substrate, an inorganic substrate, a ceramic substrate, a silicon wafer, a fabric sheet, or a combination thereof 3. The colorimetric sensor of claim 1, wherein said curable layer further comprises one or more polymerizable monomers alone or in combination with at least one non-functionalized polymer.

4. The colorimetric sensor of claim 1, wherein said curable layer further comprises at least one non-functionalized polymer.

5. The colorimetric sensor of claim 1, wherein said curable layer comprises (a) one or more polymerizable monomers and (b) said functionalized polymer.

6. The colorimetric sensor of claim 1, further comprising at least one additional layer over said curable layer, said at least one additional layer comprising an optically clear protective layer, a masking layer, or a combination thereof.

7. The colorimetric sensor of claim 1, wherein said one or more optical properties comprise a color, an optical thickness, a reflectance spectrum value, or a combination thereof.

8. The colorimetric sensor of claim 1, wherein said sensor either displays a first color or is colorless when viewed through said curable layer, and when exposed to a threshold amount of radiation or thermal energy either (i) undergoes a color change from said first color to a second color, (ii) undergoes a color change from said first color to a colorless condition, or (iii) undergoes a color change from a colorless state to a color-containing state.

9. An array comprising two or more colorimetric sensors, at least one of which comprises the colorimetric sensor of claim 1.

10. A device comprising:
the colorimetric sensor of claim 1, and
a housing at least partially enclosing the colorimetric sensor, wherein the housing comprises at least one opening positioned above said curable layer, said at least one opening providing a restricted view of an upper surface of said curable layer.

11. A method of detecting exposure of an article to a threshold amount of radiation or thermal energy, said method comprising the steps of:
providing an article;
providing the colorimetric sensor of claim 1;
exposing (i) the article and (ii) the sensor to a radiation or thermal energy source, and
monitoring the sensor for a change in one or more optical properties resulting from exposure to the threshold amount of radiation or thermal energy.

12. The method of claim 11, wherein the article comprises a curable article, an article moving through a processing line, an article subjected to a sterilization process, an article forming a part of or used in combination with a germicidal lamp, an article forming a part of or used in combination with clothing or other wearable items, or a portion of a human body.

13. The method of claim 11, wherein the method comprises a continuous process in which the article travels along a path through one or more process stations.

14. The method of claim 11, wherein said exposing step comprises two or more separate process steps in which (i) the article and (ii) the sensor are exposed to a radiation or thermal energy source in the two or more separate process steps.

15. A method of measuring an amount of exposure of an article to radiation or thermal energy, said method comprising the steps of:
providing an article;
providing a colorimetric sensor having a first set of optical properties and comprising:
a support substrate;
a reflective surface on the support substrate; and
a curable layer over the reflective surface, the curable layer comprising a functionalized polymer having pendant free-radically polymerizable groups, the functionalized polymer comprising the reaction product of (i) a polymer reactant having functional groups thereon, the functional group selected from a nucleophilic group or an electrophilic group and (ii) a bifunctional reactant comprising a reactive group capable of undergoing a nucleophilic/electrophilic reaction with the functional groups of the polymer reactant and at least one pendant free-radically polymerizable group;
exposing the article and the sensor to a radiation or thermal energy source so as to (1) polymerize the pendant free-radically polymerizable groups and (2) produce a colorimetric sensor having a second set of optical properties, and
comparing the second set of optical properties to the first set of optical properties.

16. The method of claim 15, wherein said exposing step comprises two or more separate process steps in which the article and sensor are exposed to a radiation or thermal energy source, and the sensor provides an indication of a cumulative amount of radiation or thermal energy from said two or more separate process steps.

17. The method of claim 15, wherein said comparing step comprises measuring a change in a spectral blueshift of the sensor.

18. A method of tailoring a colorimetric sensor to exhibit a change in one or more optical properties upon exposure to a predetermined amount of radiation or thermal energy, said method comprising the steps of:
choosing a specific amount of radiation or thermal energy;
formulating a curable composition that (1) polymerizes a functionalized polymer having pendant free-radically polymerizable groups and (2) exhibits a change in one or more optical properties when (i) applied over a reflective surface at a curable layer thickness, and (ii) subsequently exposed to the specific amount of radiation or thermal energy;
providing a support substrate having the reflective surface thereon; and
applying the curable composition over the reflective surface so as to form a curable layer having the curable layer thickness, wherein the curable composition comprises the functionalized polymer having pendant free-radically polymerizable groups and the functionalized polymer comprises the reaction product of (i) a polymer reactant having functional groups thereon, the functional group selected from a nucleophilic group or an electrophilic group and (ii) a bifunctional reactant comprising a reactive group capable of undergoing a nucleophilic/electrophilic reaction with the functional groups of the polymer reactant and the at least one pendant free-radically polymerizable functional group.

19. The method of claim 18, further comprising:
positioning the sensor in proximity to or on an article that is to be exposed to radiation or thermal energy; and
exposing the sensor and article to an amount of radiation or thermal energy.

20. The colorimetric sensor of claim 1, wherein said at least one pendant free-radically polymerizable functional group of the bifunctional reactant comprises a vinyl group, a vinyloxy group, a (meth)acrylic group, a (meth)acryloyl group, a (meth)acryloxy group, a propargyl group, a (meth)acrylamido group, or an acetylenic functional group.

21. The colorimetric sensor of claim 1, wherein said reactive group of the bifunctional reactant comprises a hydroxyl group, a secondary amino group, an oxazolinyl group, an oxazolonyl group, an acetyl group, an acetonyl group, a carboxyl group, an isocyanato group, an epoxy group, an aziridinyl group, an acyl halide group, a vinyloxy group, or a cyclic anhydride group.

22. The method of claim 18, further comprising:
covering the curable layer with at least one additional layer so as to sandwich the curable layer between the reflective surface and the at least one additional layer.

23. The colorimetric sensor of claim 1, further comprising at least one additional layer over said curable layer, said at least one additional layer being temporarily bonded to said curable layer.

24. The colorimetric sensor of claim 1, further comprising a masking layer over a portion of said curable layer, said masking layer forming a pattern over said curable layer.

* * * * *

UNITED STATES PATENT AND TRADEMARK OFFICE
CERTIFICATE OF CORRECTION

| | |
|---|---|
| PATENT NO. | : 7,767,143 B2 |
| APPLICATION NO. | : 11/426729 |
| DATED | : August 3, 2010 |
| INVENTOR(S) | : Michael S Wendland et al. |

It is certified that error appears in the above-identified patent and that said Letters Patent is hereby corrected as shown below:

Column 2
Line 34; Delete "thereof" and insert -- thereof. --, therefor.
Line 52; Delete "thereof" and insert -- thereof. --, therefor.

Column 7
Line 30; Delete "thereof" and insert -- thereof. --, therefor.

Column 8
Line 34; Delete "photoinitator" and insert -- photoinitiator --, therefor.

Column 11
Line 19; Delete ""ELVALOY","" and insert -- "ELVALOY" --, therefor.
Line 32; Delete "thereof" and insert -- thereof. --, therefor.

Column 16
Line 21; Delete "thereof" and insert -- thereof. --, therefor.

Column 29
Line 14; Claim 2, delete "thereof" and insert -- thereof. --, therefor.

Signed and Sealed this
Thirtieth Day of August, 2011

David J. Kappos
*Director of the United States Patent and Trademark Office*